US012684827B2

(12) United States Patent
Lee et al.

(10) Patent No.: US 12,684,827 B2
(45) Date of Patent: Jul. 14, 2026

(54) SEMICONDUCTOR DEVICE AND METHOD FOR FORMING THE SAME WITH DOPING REGIONS HAVING DIFFERENT CONDUCTIVITY TYPES

(71) Applicant: Vanguard International Semiconductor Corporation, Hsinchu (TW)

(72) Inventors: Wen-Shan Lee, Hsinchu City (TW); Chung-Yeh Lee, Xinpu Township (TW); Fu-Hsin Chen, Zhudong Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 510 days.

(21) Appl. No.: 18/164,319

(22) Filed: Feb. 3, 2023

(65) Prior Publication Data

US 2024/0266391 A1    Aug. 8, 2024

(51) Int. Cl.
| | |
|---|---|
| *H10D 62/10* | (2025.01) |
| *H10D 30/01* | (2025.01) |
| *H10D 30/66* | (2025.01) |
| *H10D 64/00* | (2025.01) |
| *H10P 30/20* | (2026.01) |
| *H10P 30/22* | (2026.01) |

(52) U.S. Cl.
CPC ....... *H10D 62/109* (2025.01); *H10D 30/0297* (2025.01); *H10D 30/668* (2025.01); *H10D 64/117* (2025.01); *H10P 30/204* (2026.01); *H10P 30/21* (2026.01); *H10P 30/22* (2026.01); *H10P 30/222* (2026.01)

(58) Field of Classification Search
CPC ............ H10D 62/109; H10D 30/0297; H10D 30/668; H10D 64/117; H10D 12/031; H10D 62/8325; H10D 64/518; H10D 62/111; H10D 62/157; H10D 62/393; H01L 21/26513; H01L 21/26586; H01L 21/266; H01L 21/0465; H01L 21/047
USPC ......................................................... 257/493
See application file for complete search history.

(56) References Cited

U.S. PATENT DOCUMENTS

| | | | | |
|---|---|---|---|---|
| 2008/0199997 A1* | 8/2008 | Grebs | .................. | H10D 62/127 257/E29.264 |
| 2011/0284954 A1* | 11/2011 | Hsieh | .................. | H10D 30/668 257/331 |

(Continued)

*Primary Examiner* — Mohammad M Hoque
(74) *Attorney, Agent, or Firm* — Birch, Stewart, Kolasch & Birch, LLP

(57) ABSTRACT

A semiconductor structure including a substrate, an epitaxy layer, an electrode structure, a first sidewall doping region, a second sidewall doping region, and a bottom doping region is provided. The substrate has a first conductivity type. The epitaxy layer has a first conductivity type and is disposed on the substrate. The electrode structure is disposed in the epitaxy layer. The electrode structure extends along a first direction. The first sidewall doping region has the first conductivity type and is disposed on one side of the electrode structure. The second sidewall doping region has a second conductivity type different than the first conductivity type and is disposed on the other side of the electrode structure. The bottom doping region has the second conductivity type and is disposed under the electrode structure. The second sidewall doping region is connected to the bottom doping region.

19 Claims, 14 Drawing Sheets

(56)     References Cited

U.S. PATENT DOCUMENTS

2016/0099316 A1*  4/2016  Arai ...................... H01L 21/047
                                                257/77
2019/0198650 A1*  6/2019  Wuebben ............. H10D 12/481
2020/0035791 A1*  1/2020  Oshima .............. H10D 62/8325
2021/0320170 A1*  10/2021  De-Michielis ....... H10D 12/481

* cited by examiner

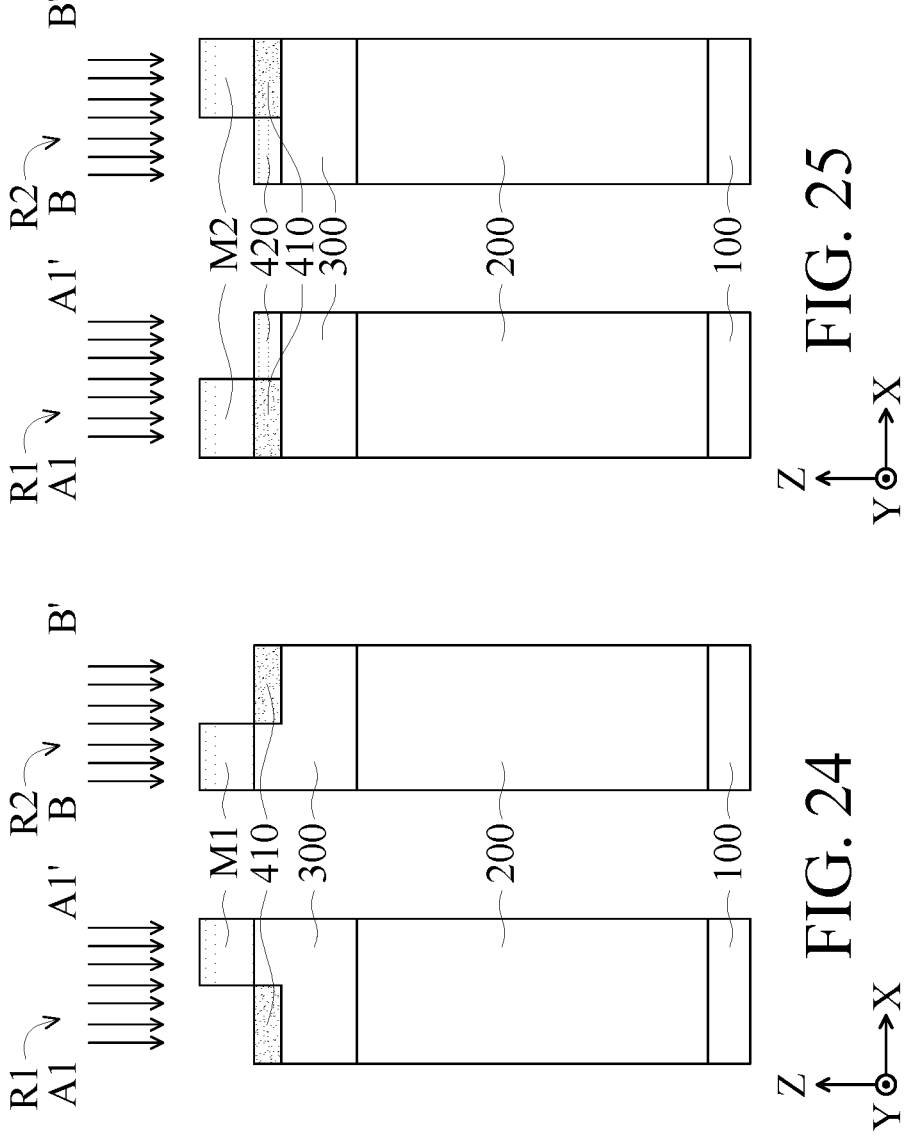
FIG. 25
FIG. 24
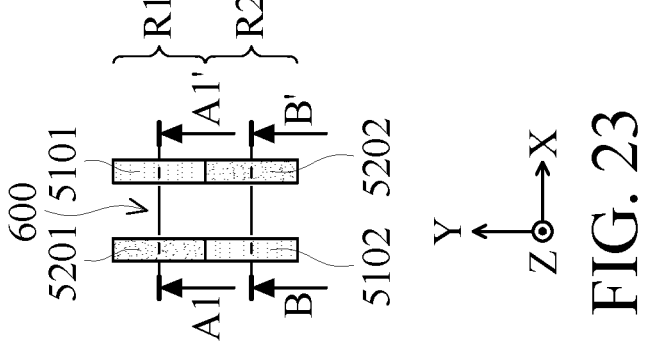
FIG. 23

SEMICONDUCTOR DEVICE AND METHOD FOR FORMING THE SAME WITH DOPING REGIONS HAVING DIFFERENT CONDUCTIVITY TYPES

BACKGROUND

Field of the Disclosure

The present disclosure relates to a semiconductor device and a method for forming the same, and more particularly to a semiconductor device having a vertical reduced surface field (RESURF) and an asymmetric doping region.

Description of the Related Art

High-voltage device technology is generally used in high-voltage and high-power circuits, as well as in drive circuits. In order to meet the performance requirements of high withstand voltage, high current and high power density for traditional power transistors, the structure of power devices is developed from a plane direction to a vertical direction. Recently, structures such as vertical trench gate metal oxide semiconductor field effect transistors have been developed.

However, a power device can easily generate an excessive electric field at the corner of the bottom of the device, this leads to current concentration, which in turn causes the temperature of the power device to rise, causing problems such as thermal runaway, high resistance of the channel region, and the like. Existing high-voltage semiconductor devices are not satisfactory in all respects, and further improvement is still needed to meet practical requirements.

Therefore, it is necessary to find a novel metal oxide semiconductor field effect transistor and a method for forming the same to solve or improve upon the problems mentioned above.

BRIEF SUMMARY

A semiconductor device is provided. The semiconductor device includes a substrate, an epitaxy layer, an electrode structure, a first sidewall doping region, a second sidewall doping region, and a bottom doping region. The substrate has a first conductivity type. The epitaxy layer has the first conductivity type and is disposed on the substrate. The electrode structure is disposed in the epitaxy layer. The electrode structure extends along a first direction. The first sidewall doping region has the first conductivity type and is disposed on one side of the electrode structure. The second sidewall doping region has a second conductivity type and is disposed on the other side of the electrode structure. The second conductivity type is different from the first conductivity type. The bottom doping region has the second conductivity type and is disposed under the electrode structure. The second doping region is connected to the bottom doping region.

A method for forming a semiconductor device is provided. The method includes providing a substrate; forming an epitaxy layer on the substrate; forming a trench in the epitaxy layer along a first direction; and forming a doping region surrounding the trench. The substrate has a first conductivity type. The epitaxy layer has the first conductivity type. The forming the doping region comprises: performing a first ion implantation and a second ion implantation on both sides of the trench to form a first sidewall doping region and a second sidewall doping region. The first sidewall doping region and the second sidewall doping region respectively have the first conductivity type and the second conductivity type. The first ion implantation and the second ion implantation are performed in a way that is not perpendicular to the substrate. The method further comprises forming an electrode structure in the trench.

A detailed description is given in the following embodiments with reference to the accompanying drawings.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

FIG. 23 is an enlarged view of the frame in FIG. 19 or FIG. 21.

FIGS. 24-32 are cross-sectional views illustrating the formation of a semiconductor device at different stages according to some another embodiments of the present disclosure.

DETAILED DESCRIPTION

Figure 3:
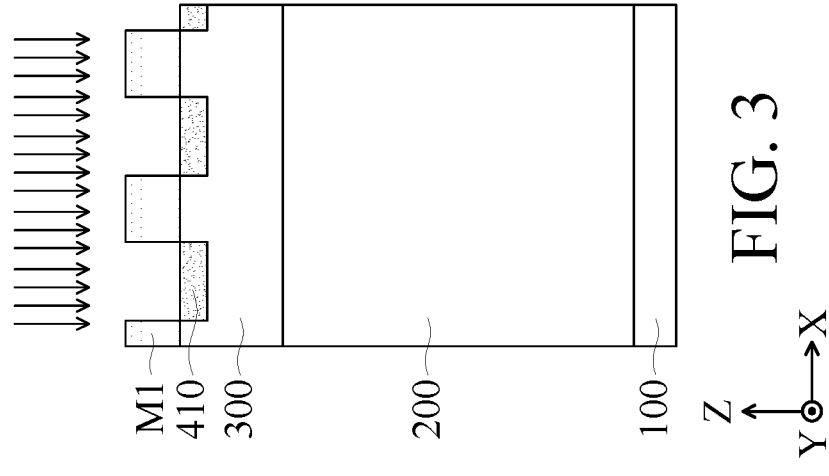
FIGS. 1-17 are cross-sectional views illustrating the formation of a semiconductor device at different stages according to some embodiments of the present disclosure.

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present invention may repeat reference numerals and/or letters in the various examples. This repetition is for the purpose of simplicity and clarity and does not in itself dictate a relationship between the various embodiments and/or configurations discussed.

Some variations of the embodiments are described below. In the different drawings and described embodiments, similar reference numerals are used to designate similar elements. It will be appreciated that additional operations may be provided before, during, and after the method, and that some of the described operations may be replaced or deleted for other embodiments of the foregoing method.

Furthermore, spatially relative terms, such as "over", "below," "lower," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented and the spatially relative descriptors used herein may likewise be interpreted accordingly.

In the embodiment of the present disclosure, the doping regions on both sidewalls surrounding the electrode structure having different conductivity types may reduce the surface electric field and reduce the drain-to-source on-resistance (Rdson) (hereafter also referred to as on-resistance) without affecting the breakdown voltage. Specifically, the sidewall doping region with n-type conductivity type may reduce the resistance caused by the parasitic junction field-effect transistor (JFET), and the sidewall doping region with p-type conductivity type may reduce the surface electric field of the superjunction when the device is turned off.

In addition, the embodiment of the present disclosure may further reduce the electric field and increase the breakdown voltage by the bottom doping region covering the bottom of the electrode structure. Moreover, the gate-to-source capacitance (Cgs) and the drain-to-source capacitance (Cds) may be further reduced by the bottom doping region and the sidewall doping region having p-type conductivity type.

In addition, in the embodiment of the present disclosure, the traditional electrode structure is replaced with the separated trench electrode structure, which may further reduce the contact area between the gate electrode and the drift region, and more effectively reduce the gate-to-drain capacitance (Cgd).

Some variations of the embodiments are described below. In the different drawings and described embodiments, similar reference numerals have been used to designate similar elements.

FIGS. 1-17 are cross-sectional views illustrating the formation of a semiconductor device at different stages according to some embodiments of the present disclosure. Additional operations may be provided before, during, and/or after the stages described in FIGS. 1-17. In various embodiments, some of the aforementioned operations may be moved, deleted or replaced. Additional components may be added to the semiconductor device. In various embodiments, some components described below may be removed, deleted or substituted.

It should be noted that the structure of forming a single transistor (including a single electrode structure) will be described below, but a structure of multiple transistors (including a plurality of electrode structures) may also be formed at the same time as shown in the figure.

Figure 1:
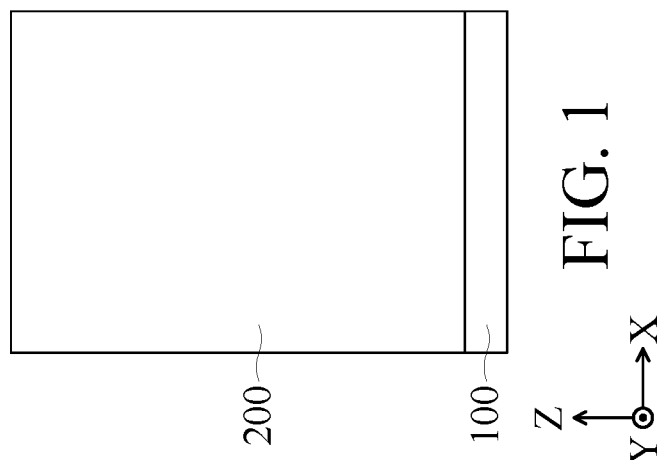

Referring to FIG. 1, a substrate 100 having a first conductivity type is provided. Here, the substrate 100 is defined as extending along the plane formed by a direction X and a direction Y, and a film layer is formed on the substrate 100 along a Z direction. The cross-sectional views shown in the context are all shown as the plane formed by the direction X and the direction Z.

In some embodiments, the substrate 100 may be made of silicon or other semiconductor materials, such as silicon wafers, bulk semiconductors or wide-gap semiconductors. In some embodiments, the substrate 100 may be an elemental semiconductor, such as a silicon substrate; the substrate 100 may also be a compound semiconductor, such as silicon carbide or gallium nitride. In some embodiments, the substrate 100 may also include silicon on insulator (SOI) or other suitable substrates. In the embodiment of the present invention, the substrate 100 is, for example, silicon carbide doped with the first conductivity type. In the application of a vertical trench-gate MOSFET, the substrate 100 having the first conductivity type may be used as a drain region of the semiconductor device. In the embodiment of the present invention, the first conductivity type is n-type, but it is not limited thereto. In some other embodiments, the first conductivity type may also be p-type.

Continuing to refer to FIG. 1, an epitaxy layer 200 having the first conductivity type is formed on the substrate 100. That is, the substrate 100 and the epitaxy layer 200 have the same conductivity type. In this embodiment, the epitaxy layer 200 is, for example, n-type. In some embodiments, the doping concentration (such as about $10^{15}$-$10^{16}$ atoms/cm$^3$) of the epitaxy layer 200 is less than the doping concentration ($10^{19}$-$10^{21}$ atoms/cm$^3$) of the substrate 100. In some embodiments, the formation of the epitaxy layer 200 may include epitaxial growth processes, such as metal organic chemical vapor deposition (MOCVD), plasma-enhanced chemical vapor deposition (plasma-enhanced CVD, PECVD), molecular beam epitaxy (MBE), hydride vapor phase epitaxy (HYPE), liquid phase epitaxy (LPE), chloride vapor phase epitaxy (Cl-VPE), other suitable process methods, or a combination of the foregoing. In the application of the vertical trench gate MOSFET, the epitaxy layer 200 having the first conductivity type may be used as a drift region of the semiconductor device.

Figure 2:
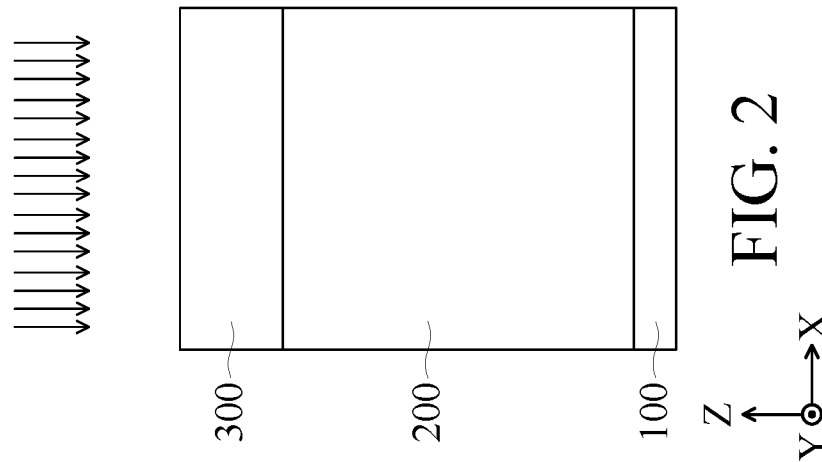

Next, referring to FIG. 2, a well region 300 having a second conductivity type is formed in the epitaxy layer 200. That is, the well region 300 and the epitaxy layer 200 have different conductivity types. In the embodiment of the present invention, the well region 300 is p-type, and its dopant is, for example, aluminum (Al), boron (B) or other suitable dopant. In some embodiments, the doping concentration of the well region 300 (such as about $10^{17}$-$10^{18}$ atoms/cm$^3$) is greater than the doping concentration of the epitaxy layer 200. In some embodiments, the formation of the well region 300 may include an ion implantation process, such as performing an blanket ion implantation process on the epitaxy layer 200 along the Z direction (such as perpendicular to the substrate 100 or a direction at 90° to the substrate 100). In the application of the vertical trench gate MOSFET, the well region 300 with the second conductivity type may be used as a channel region of the semiconductor device.

Figures 4, 5, 6:
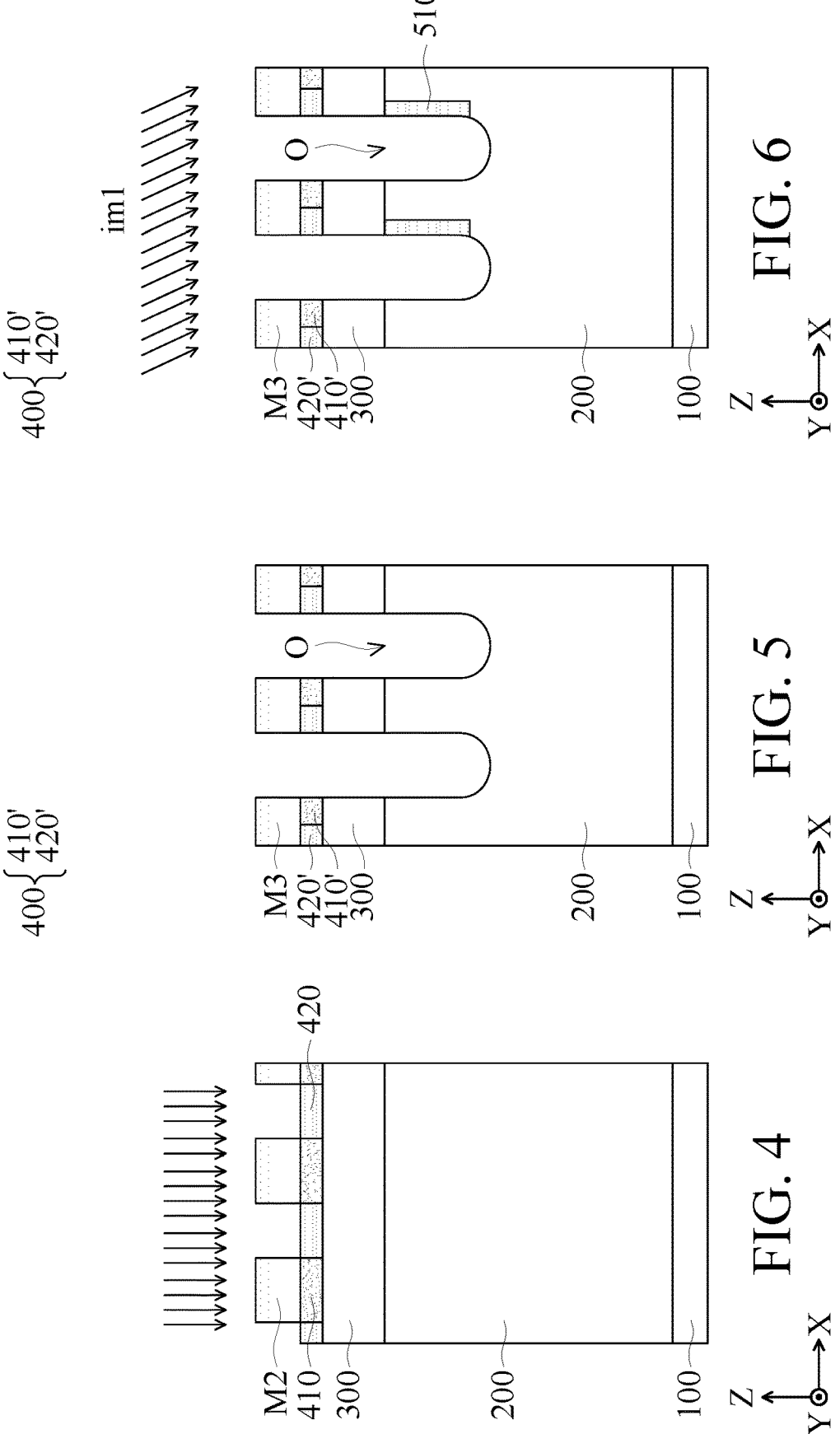

Next, referring to FIGS. 3-4, a contact doping region 400 is formed in the well region 300. The contact doping region 400 includes a first contact doping region 410 and a second contact doping region 420 adjacent to each other and having different conductivity types. Thus, the well region 300 may be subsequently connected to the source through a good ohmic contact to reduce the body effect and stabilize the initial voltage. Its formation is described in detail as follows.

As shown in FIG. 3, masks M1 are disposed at non-predetermined doping positions, and a blanket ion implantation is performed on the well region 300 through an ion implantation to form the first contact doping region 410 in the well region 300 between the masks M1. Next, the masks M1 are removed. In some embodiments, the ion implantation may be a straight ion implantation or an oblique ion implantation and the like, but it is not limited thereto.

The depth of the first contact doping region 410 may be controlled by adjusting the implantation energy or other suitable methods. In the embodiment of the present invention, the depth of the first contact doping region 410 does not exceed the depth of the well region 300 (that is, the well region 300 covers the bottom surface of the first contact doping region 410), so as to reduce the body effect. The removal of the masks M1 may include an ashing process, a wet etching process (such as acid etching), or other suitable processes.

As shown in FIG. 4, masks M2 are disposed at non-predetermined doping positions (such as directly above the first contact doping region 410), and a blanket ion implantation is performed on the well region 300 through an ion implantation to form the second contact doping region 420 in the well region 300 between the masks M2. Next, the masks M2 are removed. In some embodiments, the ion implantation may be a straight ion implantation or an oblique ion implantation and the like, but it is not limited thereto.

Similarly, the depth of the second contact doping region 420 may also be controlled by adjusting the implantation energy or other suitable methods. In the embodiment of the present invention, the depth of the second contact doping region 420 generally does not exceed the depth of the well region 300 (that is, the well region 300 covers the bottom surface of the second contact doping region 420). The removal of the masks M2 is similar to the one described above, and will not be repeated here.

In some embodiments, the positions and shapes of the masks M1 and the masks M2 may be appropriately adjusted according to design requirements. For example, the masks M1 and the masks M2 may be disposed in a complementary manner in sequence (the positions are not repeated at all), or the masks M1 and the masks M2 may be disposed in a partially overlapping manner or the like.

The formation order of the first contact doping region 410 and the second contact doping region 420 is not particularly limited. For example, the first contact doping region may also be formed after the second contact doping region 420 is formed. As long as the conductivity types of the first contact doping region 410 and the second contact doping region 420 are different, there is no particular limitation. For example, in the embodiment of the present invention, the first contact doping region 410 and the second contact doping region 420 may have the second conductivity type and the first conductivity type, respectively, such as p-type and n-type, and the dopants thereof are, for example, aluminum (Al) and nitrogen (N), respectively. In some embodiments, the doping concentration of the first contact doping region 410 and the second contact doping region 420 (about $10^{19}$-$10^{20}$ atoms/cm$^3$) is greater than the doping concentration of the well region 300 to reduce the contact resistance and thus reduce on-resistance (Rdson).

Next, referring to FIG. 5, a trench O is formed in the epitaxy layer 200. Specifically, using masks M3 as etching masks, the trench O is formed by etching through the contact doping region 400, the well region 300 and contacting epitaxy layer 200 by an etching process along the direction Z. The remaining first contact doping region 410 and the remaining second contact doping region 420 are respectively denoted as a first contact doping region 410' and a second contact doping region 420'. In some embodiments, trench O extends along the direction Y.

In some embodiments, the masks M3 are disposed at a non-predetermined etching position to protect the underlying film layer and/or the doping region. In some embodiments, as long as the masks M3 are disposed on (covers) the first contact doping region 410' and the second contact doping region 420' at the same time to benefit forming a good ohmic contact later, there is no special limitation on area size. For example, in the embodiment of the present invention, the top surface areas of the first contact doping region 410' and the second contact doping region 420' occupy approximately 50% of the bottom surface area of the mask M3, respectively, However, the present invention is not limited thereto.

In the application of the vertical trench gate metal oxide semiconductor field effect transistor, the first contact doping region 410' with the second conductivity type and the second contact doping region 420' with the first conductivity type may serve as a source contact and a body contact of the semiconductor device respectively, and both are ohmic contacts.

In some embodiments, the etching process may include a dry etching process, a wet etching process, or other suitable etching processes. The dry etching process may include plasma etching, plasma-free gas etching, sputter etching, ion milling, reactive ion etching (RIE), neutral beam etching (NBE), inductive coupled plasma etch and the like. The wet etching process may include using an acidic solution, an alkaline solution, or a solvent to remove at least a portion of the structure to be removed. In addition, the etching process may also include pure chemical etching, pure physical etching, or any combination thereof.

Figures 7, 8, 9:
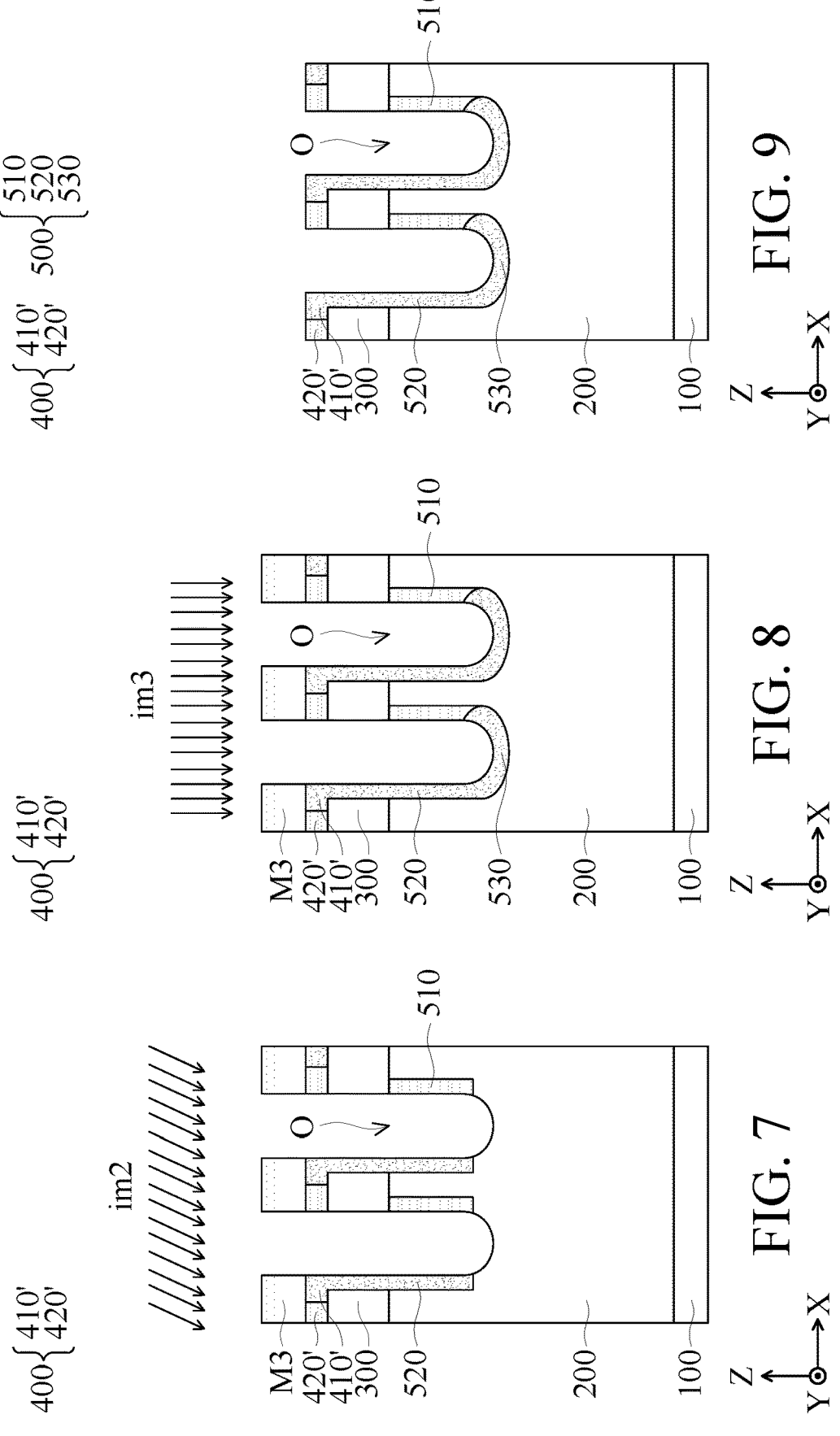

Next, referring to FIGS. 6-8, a doping region 500 is formed around the trench O. The doping region 500 includes a first sidewall doping region 510 and a second sidewall doping region 520 with different conductivity types on both sides of the trench O, and a bottom doping region 530 at the bottom of the trench O, thereby reducing the surface electric field and reducing the gate-to-drain capacitance (Cgd). Its formation is described in detail as follows.

As shown in FIGS. 6-7, ion implantation is performed on a side of the trench O by a first ion implantation process im1, and then ion implantation is performed on the other side of the trench O by a second ion implantation process im2 to form sidewall doping region 510 and sidewall doping region 520 with different conductivity types, respectively.

In some embodiments, the first ion implantation process im1 and the second ion implantation process im2 include performing ion implantation on the sidewall of the trench O in a manner that is not perpendicular to the substrate 100 (not along the direction Z). In other word, ion implantation is not performed on the bottom of the trench O. That is, as long as the implantation angles of the first ion implantation process im1 and the second ion implantation process im2 are not parallel to the normal of the substrate 100 and may be implanted on the sidewall of the trench O, there is no particular limitation. In some embodiments, the first ion implantation process im1 and the second ion implantation process im2 may be oblique ion implantations, for example.

In some embodiments, as long as the dopant conductivity types of the first ion implantation process im1 and the second ion implantation process im2 are different, there is no special limitation. For example, in the embodiment of the present invention, the first ion implantation process im1 and the second ion implantation process im2 may respectively use dopants of the first conductivity type and the second conductivity type, that is, n-type and p-type. Thus, the sidewall doping region 510 and the sidewall doping region 520 may be the first conductivity type and the second conductivity type, respectively, that is, n-type and p-type, and the dopants thereof are, for example, nitrogen (N) and aluminum (Al), respectively, but the invention is not limited thereto.

In some embodiments, the sidewall doping region 510 is separated from the contact doping region 400 by the well region 300, and the sidewall doping region 520 contacts the contact doping region 400 through the well region 300. In detail, the sidewall doping region 520 contacts the second contact doping region 420'.

In the embodiment of the present invention, after the first ion implantation process im1 with the first conductivity type dopant and the second ion implantation process im2 with the second conductivity type dopant, the both sides of the well region 300 have different doping concentration. In detail, a concentration of the second conductivity type in one side of the well region 300 is greater than that in the middle portion of the well region 300, and a concentration of the second conductivity type in the other side of the well region 300 is less than that in the middle portion of the well region 300. Thus, a doping concentration gradient of the second conductivity type from low to high is formed in the direction X. Thereby, the situation of punch through may be prevented at the higher doping concentration, and the threshold voltage may be reduced at the lower doping concentration.

As shown in FIG. 8, a third ion implantation process im3 is performed on the bottom of the trench O to form a bottom doping region 530. That is, the bottom doping region 530 covers the entire bottom of the trench O. Thereby, the electric field at the corner of the trench O may be effectively reduced.

In some embodiments, ion implantation is performed on the bottom of the trench O by the third ion implantation process im3 in a manner that is perpendicular to the substrate 100 (along the direction Z). In some embodiments, the third ion implantation process im3 may be, for example, a straight ion implantation, but the invention is not limited thereto. In some embodiments, the third ion implantation process im3 uses dopants with the second conductivity type, that is, p-type. Thus, the bottom doping region 530 may have the second conductivity type, that is, p-type, and its dopant is, for example, aluminum (Al).

In some embodiments, the doping concentration of the bottom doping region 530 (about $10^{16}$-$10^{19}$ atoms/cm$^3$) is greater than or equal to the doping concentration of the sidewall doping region 510 or the sidewall doping region 520 (about $10^{15}$-$10^{18}$ atoms/cm$^3$). Thereby, the electric field at the bottom and corner of the trench O may be further reduced while reducing the impact on the channel region.

It should be noted that the first contact doping region 410', the sidewall doping region 520 and the bottom doping region 530 as shown in FIG. 8 only represent the same conductivity type, so there is no clear boundary between the three. However, actual doping levels may vary depending on product requirements.

It should be noted that when performing ion implantation as shown in FIGS. 6-8, the masks M3 remain disposed on the contact doping region 400, so as to prevent the contact doping region 400 from being affected and changing its conductivity type. Also, after the ion implantation is completed, the masks M3 are removed. The method for removing the masks M3 is similar to that described above, and will not be repeated here.

It should be noted that although the embodiment of the present invention describes the formation of the doping region 500 in the order as shown in FIGS. 6-8, the skilled person in the art may also adjust the order of the steps appropriately according to actual needs. For example, after the third ion implantation process is performed to form the bottom doping region, the first and second ion implantation processes are performed to form the sidewall doping regions.

The embodiment of the present invention may prevent the subsequently formed electrode structure from directly contacting the epitaxy layer by forming the doping region surrounding the trench, thereby reducing the gate-to-drain capacitance (Cgd) and the drain-to-source capacitance (Cds). Moreover, the embodiment of the present invention may further reduce the surface electric field and increase the breakdown voltage by the bottom doping region.

Next, referring to FIG. 9, after the masks M3 are removed, performing an activation on the contact doping region 400 and the doping region 500.

In some embodiments, the activation may be performed before or after forming the electrode structure according to the substrate material. For example, when the substrate material is silicon, since the activation (or annealing) temperature is, for example, 900° C., the activation may be performed after the electrode structure is formed without affecting the electrode structure. When the substrate material is silicon carbide, since the activation temperature is, for example, 1800° C., the elements of the electrode structure to be formed later may melt away. Thus, the activation must be performed before forming the electrode structure. In addition, if the substrate material is SiC, a graphite cap may be formed before the activation and removed after the activation to maintain roughness of the SiC surface during the activation.

Next, referring to FIGS. 10-14, an electrode structure 600 is formed in the trench O. The electrode structure 600 may be a general gate trench structure or a split gate trench structure. In an embodiment of the present invention, the electrode structure 600 is a split-gate trench structure, which includes a top electrode, a bottom electrode, and a dielectric layer surrounding the top electrode and surrounding the bottom electrode. In some embodiments, the electrode structure 600 extends along the direction Y. The details of the electrode structure 600 will be described as follows.

Figures 10, 11, 12:
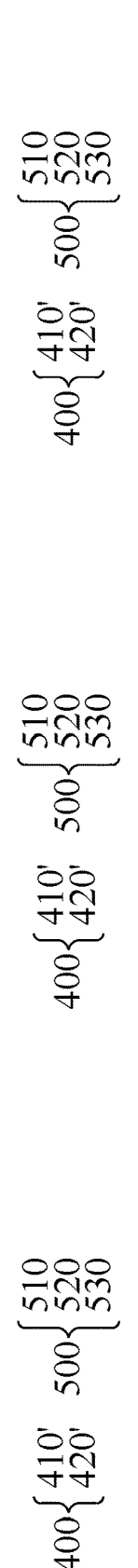

As shown in FIG. 10, a shielding dielectric layer 610 is formed blanketly on the epitaxy layer 200. In detail, a shielding dielectric layer 610 is formed on the bottom and sidewalls of the trench O. In some embodiments, the shielding dielectric layer 610 may be silicon oxide, other suitable semiconductor oxide materials, or a combination of the aforementioned materials. In some embodiments, the formation of the shielding dielectric layer 610 includes a conformal deposition process, an oxidation process, other suitable formation processes, and the like.

In some embodiments, the oxidation process may be a thermal oxidation, or other suitable processes. In some embodiments, the deposition process may be a physical vapor deposition (PVD) process, a chemical vapor deposition (CVD) process, a plasma enhanced chemical vapor deposition (PECVD), other suitable processes, or a combination of the aforementioned processes.

In some embodiments, a thermal process may be optionally performed on the shielding dielectric layer 610 to increase the density of the shielding dielectric layer 610. In some embodiments, the thermal process may be a rapid thermal annealing (RTA) process.

As shown in FIG. 11, the bottom gate 620 is formed in the trench O. In some embodiments, the bottom electrode 620 is formed on the shielding dielectric layer 610. In some embodiments, the top surface of the bottom electrode 620 is lower than the bottom surface of the well region 300. The bottom electrode 620 is separated from the epitaxy layer 200 by the shielding dielectric layer 610.

In some embodiments, the bottom electrode 620 may be a single-layer or multi-layer structure, which is made of amorphous silicon, polysilicon, one or more metals, metal nitrides, metal silicides, conductive metal oxides, or a combination of any of the aforementioned materials. In some embodiments, metals may include, but are not limited to, tungsten (W), titanium (Ti), tantalum (Ta), platinum (Pt). In some embodiments, metal nitrides may include, but are not limited to, titanium nitride (TiN) and tantalum nitride (TaN). In some embodiments, the metal silicide may include, but is not limited to, tungsten silicide ($WSi_x$). In some embodiments, the bottom electrode 620 may optionally include dopant with the second conductivity type, that is, p-type, which may be aluminum (Al), boron (B), boron difluoride ($BF_2$) or other suitable dopant.

In some embodiments, the formation of the bottom electrode 620 includes depositing a bottom electrode material (not shown) on the shielding dielectric layer 610 and the epitaxy layer 200 using a deposition process; selectively performing a thermal process (such as an annealing process) on the bottom electrode material; and then removing parts of the bottom electrode material using a removal process. Thus, the bottom electrode 620 does not fill the entire trench O (or the bottom electrode is recessed to a specific depth). In some embodiments, the above-mentioned deposition process may include metal organic chemical vapor deposition (MOCVD), sputtering, resistance heating evaporation, electron beam evaporation, suitable methods, and the like. In some embodiments, the removal process may include a planarization process, an etching process and the like, such as a chemical mechanical polishing (CMP) process, a dry etching process, and the like.

In some embodiments, in addition to reducing the gate-to-drain capacitance (Cgd) to improve the switching characteristics of the semiconductor device, the bottom electrode 620 acting as a field plate functioning to further reduce the surface electric field (RESURF). As shown in FIG. 12, a portion of the shielding dielectric layer 610 is removed. Specifically, the portion of the shielding dielectric layer 610 not covered by the bottom electrode 620 is removed by a wet etching process, and the remaining shielding dielectric layer 610 is denoted as a shielding dielectric layer 610'. The shielding dielectric layer 610' is located on the sidewalls and the bottom of a lower portion of the trench O. In some embodiments, the top surface of the shielding dielectric layer 610' may be above (not shown), below, or substantially coplanar with the top surface of the bottom electrode 620. In the embodiment of FIG. 12, the top surface of the shielding dielectric layer 610' is substantially coplanar with the top surface of the bottom electrode 620 and is slightly dished.

Figures 13, 14, 15:
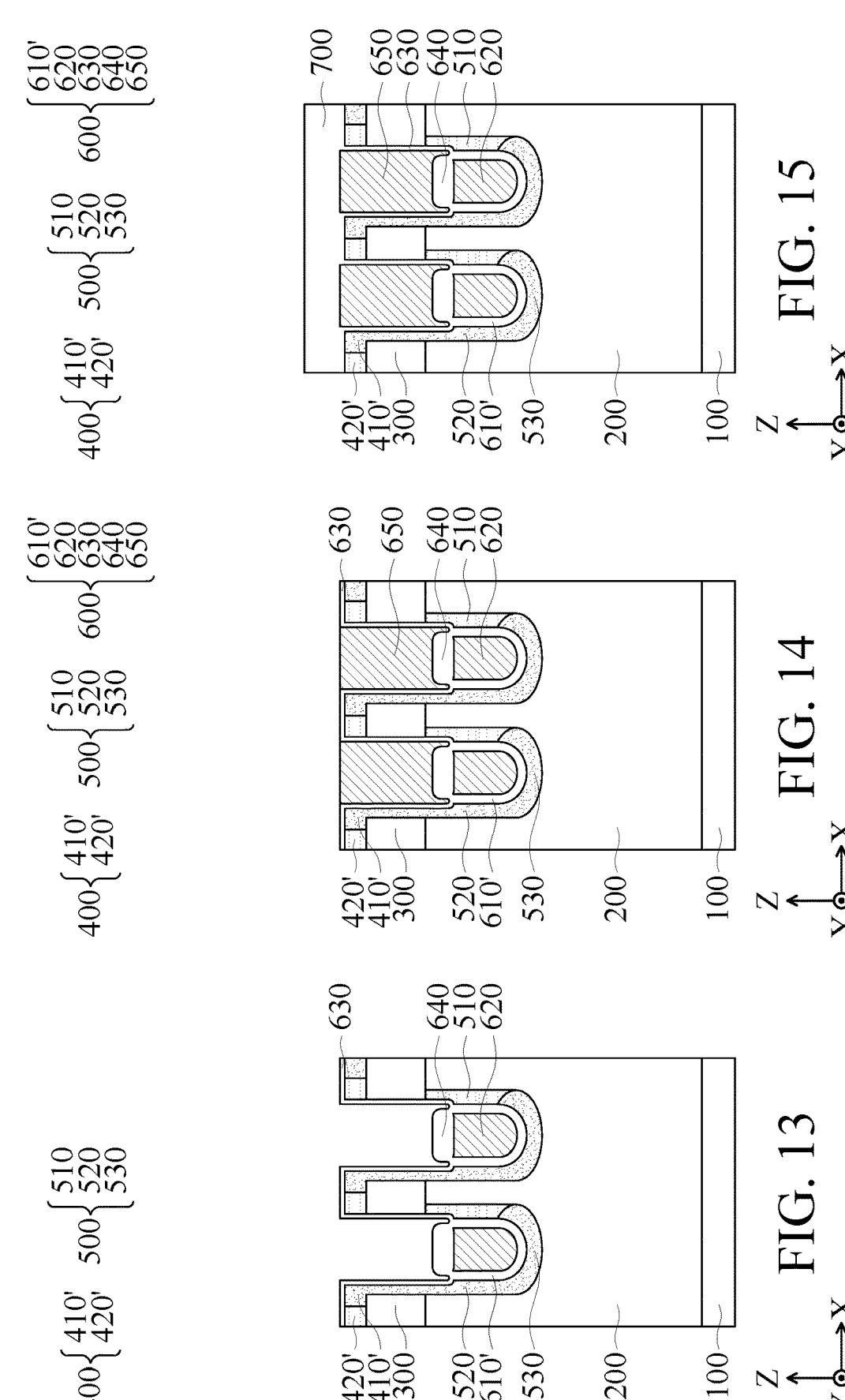

As shown in FIG. 13, a dielectric layer 630 is formed on the epitaxy layer 200, the shielding dielectric layer 610', and the bottom electrode 620. The dielectric layer 630 may serve as a gate dielectric layer for a subsequently formed top electrode.

In some embodiments, the dielectric layer 630 extends from the top surface of the epitaxy layer 200 into the trench O and covers the top surface of the shielding dielectric layer 610' and the top surface of the bottom electrode 630. In the embodiment of the present invention, the dielectric layer 630 does not fill the trench O. That is, after the dielectric layer 630 is formed, there is a space on the dielectric layer 630 in the trench O. Furthermore, in some embodiments, the thickness of the dielectric layer 630 in the trench O is less than the thickness of the shielding dielectric layer 610' in the trench O.

In some embodiments, the dielectric layer 630 may be silicon oxide, other suitable dielectric materials, or a combination of the aforementioned materials. In some embodiments, the materials of the dielectric layer 630 that is the same as or different from the materials of the shielding dielectric layer 610' may be selected according to actual requirements.

In some embodiments, the formation of the dielectric layer 630 may include an oxidation process similar to that described above, and will not be repeated here. It should be noted that during the formation of the dielectric layer 630, since the bottom electrode 620 is also oxidized, a thicker insulating portion 640 is formed above the bottom electrode 630. The insulating portion 640 is located between the bottom electrode 620 and a subsequently formed top electrode (not shown), and may be used for electrical isolation. The insulating portion 640 may also include materials similar to the dielectric layer 630, and will not be repeated here.

As shown in FIG. 14, a top electrode (or a top gate) 650 is formed in the trench O. In some embodiments, the top electrode 650 is located on the dielectric layer 630 and separated from the bottom electrode 620 by the insulating portion 640. In some embodiments, the top surface of the top electrode 650 is coplanar with the top surface of dielectric layer 630. In some embodiments, the sidewall doping region 520 with the second conductivity type covers the entire sidewall of the bottom electrode 620.

In some embodiments, the top electrode 650 may be a single-layer or multi-layer structure, and may be selected from materials similar to the bottom electrode 620, and the details will not be repeated here. In some embodiments, the materials of the top electrode 650 that are the same as or different from the materials of the bottom electrode 620 may be selected according to actual requirements. In some embodiments, the top electrode 650 may optionally include dopants with the second conductivity type, such as p-type, which may be boron (B), boron difluoride ($BF_2$) or other suitable dopants.

In some embodiments, the formation of the top electrode 650 includes depositing a top electrode material (not shown) on the dielectric layer 630 and on the insulating portion 640 using a deposition process; selectively performing a thermal process on the top electrode material; and then removing a portion of the top electrode material using a removal process. Thus, the top surface of the top electrode 650 is substantially coplanar with the dielectric layer 630. The relevant manufacturing process is similar to the one described above, and will not be repeated here.

In some embodiments, the top electrode 650 and the bottom electrode 620 may be electrically connected to the gate and the source, respectively, so as to more effectively reduce the contact area between the gate and the drift region (such as the epitaxy layer), thereby reducing the gate-to-drain capacitance (Cgd) and improving switching characteristics of semiconductor devices.

In some embodiments, the doping region 500 surrounds the electrode structure 600. In some embodiments, the sidewalls doping regions 510 and 520 with the first conductivity type and the second conductivity type are disposed on both sides of the electrode structure 600, respectively. The bottom doping region 530 with the second conductivity type is disposed at the bottom of the electrode structure. Moreover, the sidewall doping regions 510 and 520 are connected by the bottom doping region 530.

In the case where a plurality of transistors is to be formed, the following steps are also included. While the trench O is formed, another trench (such as FIG. 5) may be formed on one side of the trench O (or in the X direction of the trench O). While the doping region 500 is formed, another doping region is formed around the other trench (as shown in FIGS. 6-8). While the electrode structure 600 is formed, another electrode structure is formed in the other trench (as shown in FIGS. 10-14). In some embodiments, the electrode structure 600 is separated from the other electrode structure by the epitaxy layer 200.

In some embodiments, another doping region is disposed in the epitaxy layer 200 and surrounds the other electrode structure. In some embodiments, the other doping region is similar to the doping region 500, including another first sidewall doping region with the first conductivity type, another second sidewall doping region with the second conductivity type, and another bottom doping region with the second conductivity type. The other first sidewall doping region is connected to the other second sidewall doping region through the other bottom doping region. In some embodiments, the sidewall doping region 510 of the electrode structure 600 and the other sidewall doping region of the other electrode structure with different conductivity types are separated from each other by the epitaxy layer 200. Furthermore, the sidewall doping region of the electrode structure 600 and the other sidewall doping region of the other electrode structure with different conductivity types and the epitaxy layer 200 therebetween may be regarded as a super junction. Thereby, the dopant concentration of the first conductivity type may be increased without affecting the breakdown voltage.

Figures 16, 17, 18:
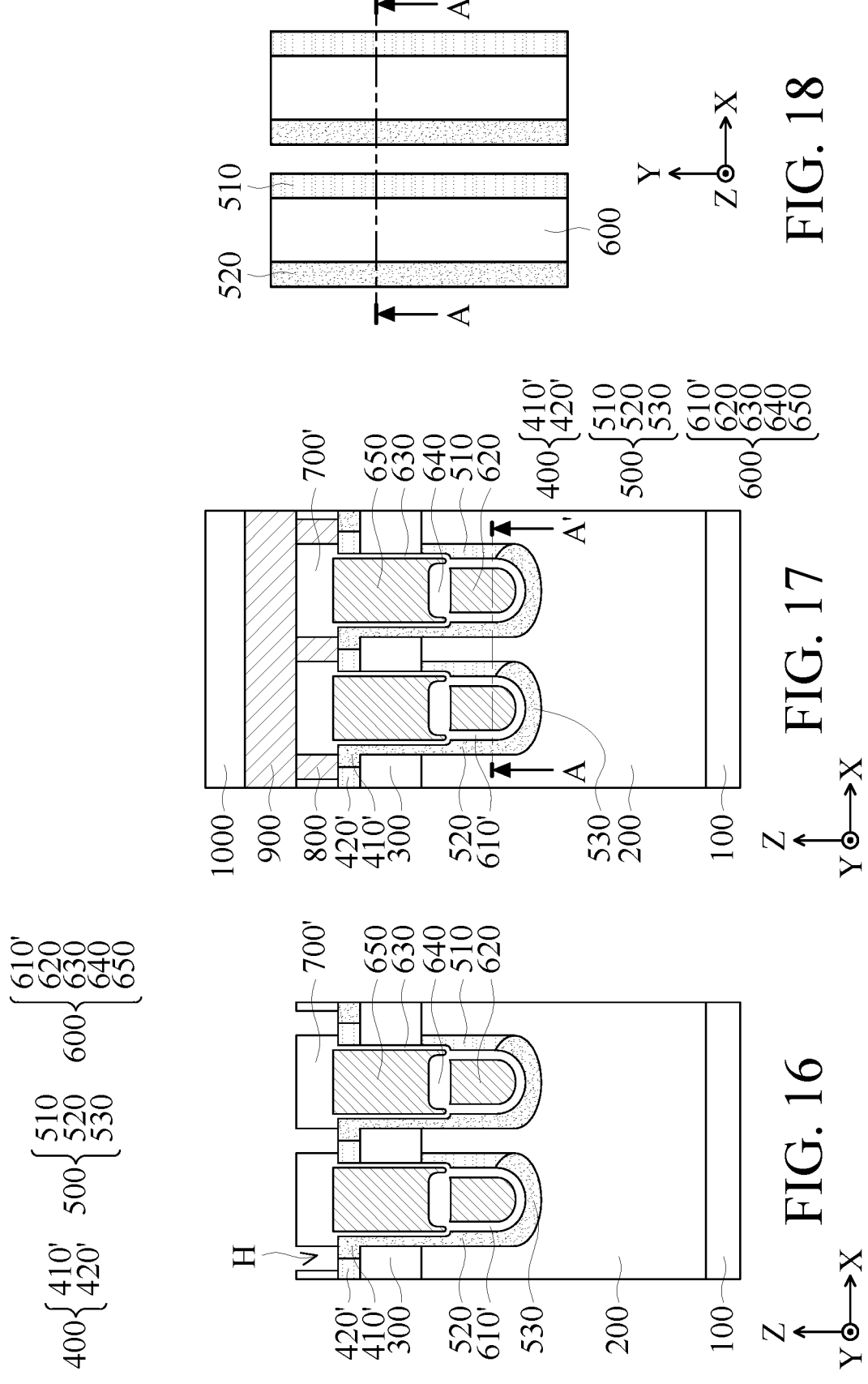
FIG. 18 is a top view viewed from top to bottom illustrating some elements of a semiconductor device according to some embodiments of the present disclosure.

Next, referring to FIGS. 15-17, a source contact 800, a source electrode 900 and a passivation layer 1000 are formed on the electrode structure 600.

As shown in FIG. 15, an interlayer dielectric layer 700 is formed on the top electrode 650 and the dielectric layer 630. In some embodiments, the interlayer dielectric layer 700 may include materials similar to the dielectric layer 630, and will not be repeated here. In some embodiments, the formation of the interlayer dielectric layer 700 may include a deposition process similar to that described above, and will not be repeated here.

As shown in FIG. 16, a contact hole H is formed in the interlayer dielectric layer 700. In some embodiments, the formation of the contact hole H may include using a mask (or photoresist) as an etching mask, and etching a portion of the interlayer dielectric layer 700 by one or more etching processes, and then removing the mask (or photoresist).

As shown in FIG. 17, a contact 800 is formed in the contact hole H. In some embodiments, the contact 800 may include a contact metal silicide, a contact metal (not shown), a barrier layer, and the like. The barrier layer may serve to prevent the subsequently formed contact metal from diffusing into the interlayer dielectric layer 700. The contact metal silicide may be used to reduce contact resistance.

In some embodiments, the contact 800 may include conductive materials including metals, metal nitrides, and the like, such as copper, silver, gold, aluminum, tungsten, titanium (Ti), titanium nitride (TiN), tantalum (Ta), tantalum nitride (TaN), cobalt (Co), nickel silicide (NiSi), cobalt silicide (CoSi), other suitable materials, or a combination of the aforementioned materials.

In some embodiments, the formation of the contact 800 may include a deposition process, a silicide process (such as a rapid thermal process (RTP), a removal process (such as an etching process or a planarization process), and the like, and the related processes are similar to the ones described above, and will not be repeated here.

As shown in FIG. 17, a source electrode 900 and a passivation layer 1000 are formed on the contact 800 and the interlayer dielectric layer 700. In some embodiments, the passivation layer 1000 is used to protect and isolate surface metals (such as source and gate metals) connected to external circuits.

In some embodiments, the source electrode 900 may include conductive materials including metals, metal alloys, and the like, such as copper, silver, gold, aluminum, tungsten, aluminum copper, other suitable materials, or combinations of the aforementioned materials. In some embodiments, the source electrode 900 and the passivation layer 1000 may be formed by a deposition process similar to the one described above, and will not be repeated here.

Next, referring to FIG. 18, it is a top view corresponding to section line A-A' in FIG. 17 viewed from top to bottom. It may be seen from FIG. 18 that the sidewall doping region 510 with the first conductivity type and the sidewall doping region 520 with the second conductivity type extend continuously along both sides of the electrode structure 600, respectively. That is, both the sidewall doping region 510 and the sidewall doping region 520 extend along the direction Y.

FIGS. 19-32 are schematic diagrams according to some another embodiments of the present invention.

Figures 19, 20, 21, 22:
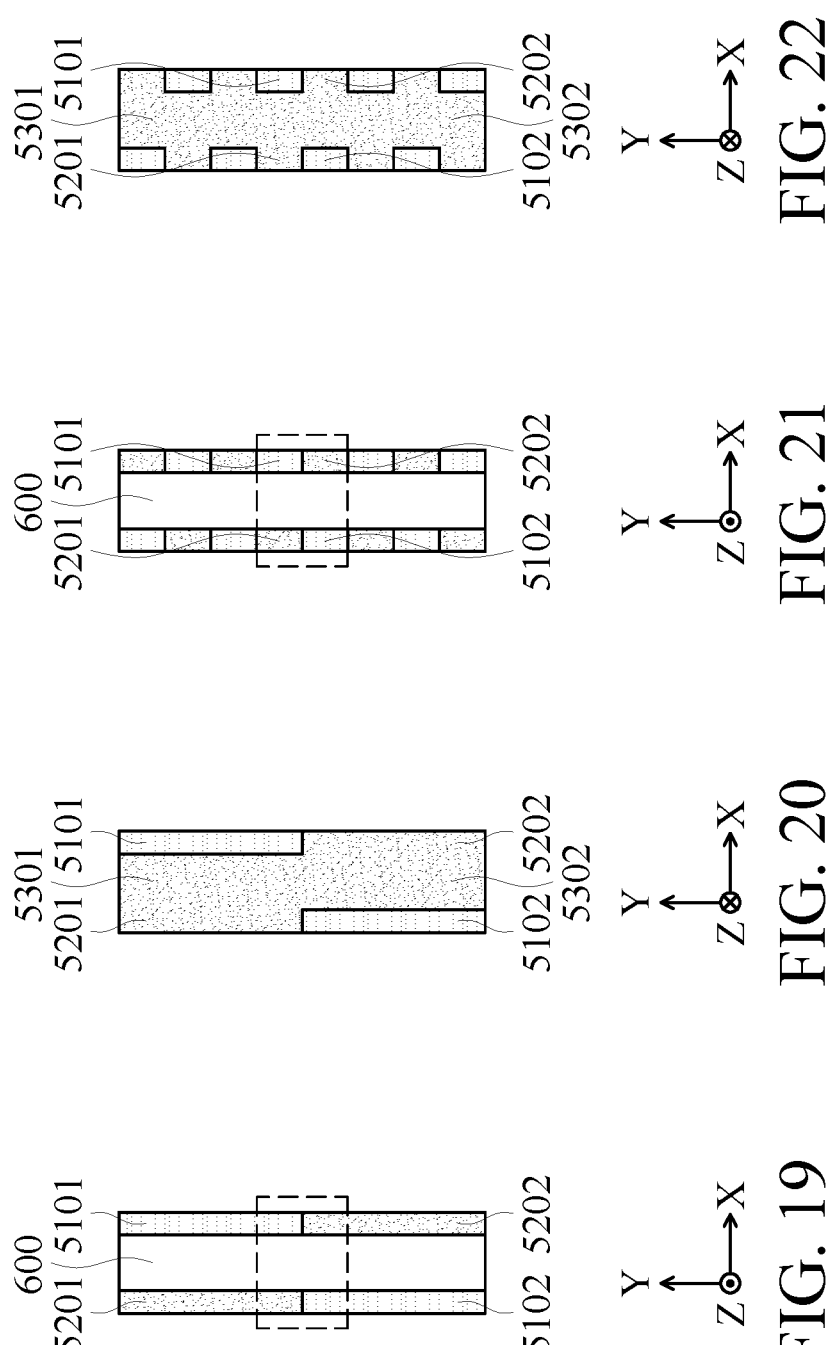
FIG. 19 is a top view viewed from top to bottom illustrating some elements of a semiconductor device according to one case of some another embodiments of the present disclosure.
FIG. 20 is a top view viewed from bottom to top illustrating some elements of a semiconductor device according to one case of some another embodiments of the present disclosure.
FIG. 21 is a top view viewed from top to bottom illustrating some elements of a semiconductor device according to another case of some another embodiments of the present disclosure.
FIG. 22 is a top view viewed from bottom to top illustrating some elements of a semiconductor device according to another case of some another embodiments of the present disclosure.

FIG. 19 and FIG. 20 are one case of some other embodiments, they respectively illustrate top views viewed from top to bottom and from bottom to top. It should be noted that the top-down view refers to the viewing angle along the direction Z toward the substrate 100; the bottom-up view refers to the viewing angle along the direction Z from the substrate 100.

FIG. 19 is similar to FIG. 18, the difference is that: along both sides of the electrode structure 600, there are sidewall doping regions with different conductivity types alternately arranged. Specifically, the sidewall doping region 5101 with the first conductivity type and the sidewall doping region 5201 with the second conductivity type respectively extend along both sides of the electrode structure 600 and are respectively connected to the sidewall doping region 5202 with the second conductivity type and the sidewall doping region 5102 with the first conductivity type. That is, the sidewall doping region 5101 is connected to the sidewall doping region 5202; the sidewall doping region 5201 is connected to the sidewall doping region 5102. In FIG. 20, it may be seen that the bottom doping regions 5301 and 5302 with the second conductivity type extend along the direction Y and completely cover the electrode structure. Moreover, in FIG. 20, the sidewall doping regions 5101 and 5102 with the first conductivity type do not overlap in the direction Y.

FIG. 21 and FIG. 22 are another case of some another embodiments, both of which illustrate top views viewed from top to bottom and top views from bottom to top. FIG. 21 is similar to FIG. 19, the difference is that along one side of the electrode structure 600, a plurality of sidewall doping regions 5101 with the first conductivity type and a plurality of sidewall doping regions 5202 with the second conductivity type are alternately arranged. Also, along the other side of the electrode structure 600, a plurality of sidewall doping region 5201 with the second conductivity type and sidewall doping region 5102 with the first conductivity type are alternately arranged. That is, one sidewall doping region 5101 is connected to two sidewall doping regions 5202 along Y direction (upper and lower directions in the drawing); one sidewall doping region 5201 is connected two sidewall doping regions 5102 along Y direction (upper and lower directions in the drawing). In FIG. 22, it may be seen that the bottom doping regions 5301 and 5302 with the second conductivity type are connected to each other, and extend along the direction Y, and completely cover the electrode structure. Moreover, in FIG. 22, the sidewall doping regions 5102 and 5101 with the first conductivity type do not overlap in the direction Y.

In order to facilitate the description of the subsequent forming process, the enlarged view of the frame in FIG. 19 or FIG. 21 is shown as FIG. 23. In FIG. 23, the doping region 500 and the electrode structure 600 are divided into a first region R1 and a second region R2 along the extension direction (or direction Y) of the electrode structure 600. That is, in the first region R1, there are sidewall doping regions 5101 and 5201 with the first conductivity type and the second conductivity type; in the second region R2, there are sidewall doping regions with the first conductivity type and the second conductivity type 5102 and 5202. In other words, in FIG. 23, the sidewall doping regions 5101 and 5201 with different conductivity types extend along both side of the same electrode structure 600. In FIG. 23, the sidewall doping region 5101 is connected to the sidewall doping region 5202; the sidewall doping region 5201 is connected to the sidewall doping region 5102.

Referring to FIG. 24-32, FIGS. 24-32 are cross-sectional views at different stages for the section line A1-A1' (first region R1) and section line B-B' (second region R2) corresponding to FIG. 23. Additional operations may be provided before, during, and/or after the stages described in FIGS. 24-32. In various embodiments, some of the aforementioned operations may be moved, deleted or replaced. Additional components may be added to the semiconductor device. In various embodiments, some of the components described below may be removed, deleted or substituted.

It should be noted that in this embodiment, in order to simplify the drawing, the structure of a single transistor (including a single electrode structure) will be shown later for description. Moreover, the structure in the first region R1 is similar to the embodiment shown in FIGS. 1-17, so the description will focus on the structure in the second region R2 later.

Referring to FIG. 24, FIG. 24 is similar to FIG. 3, and the difference is that: in the second region R2, a mask M1 is disposed at non-predetermined doping position, and a blanket ion implantation is performed on the well region 300 through an ion implantation to form a first contact doping region 410 in the well region 300 which is not covered by the mask M1. Next, the mask M1 is removed. In the embodiment of FIG. 24, the ion implantation includes dopant with the second conductivity type, such as p-type dopant (such as aluminum), so the first contact doping region 410 has the second conductivity type.

Referring to FIG. 25, FIG. 25 is similar to FIG. 4, and the difference is that: in the second region R2, a mask M2 is disposed at non-predetermined doping position (such as directly above the first contact doping region 410), and a blanket ion implantation is performed on the well region 300 through an ion implantation to form the second contact doping region 420 in the well region 300 which not is covered by M2. Next, the mask M2 is removed. In the embodiment of FIG. 25, the ion implantation includes dopant with the first conductivity type, such as n-type dopant (such as nitrogen), so the second contact doping region 420 has the first conductivity type.

Figures 26, 27, 28:
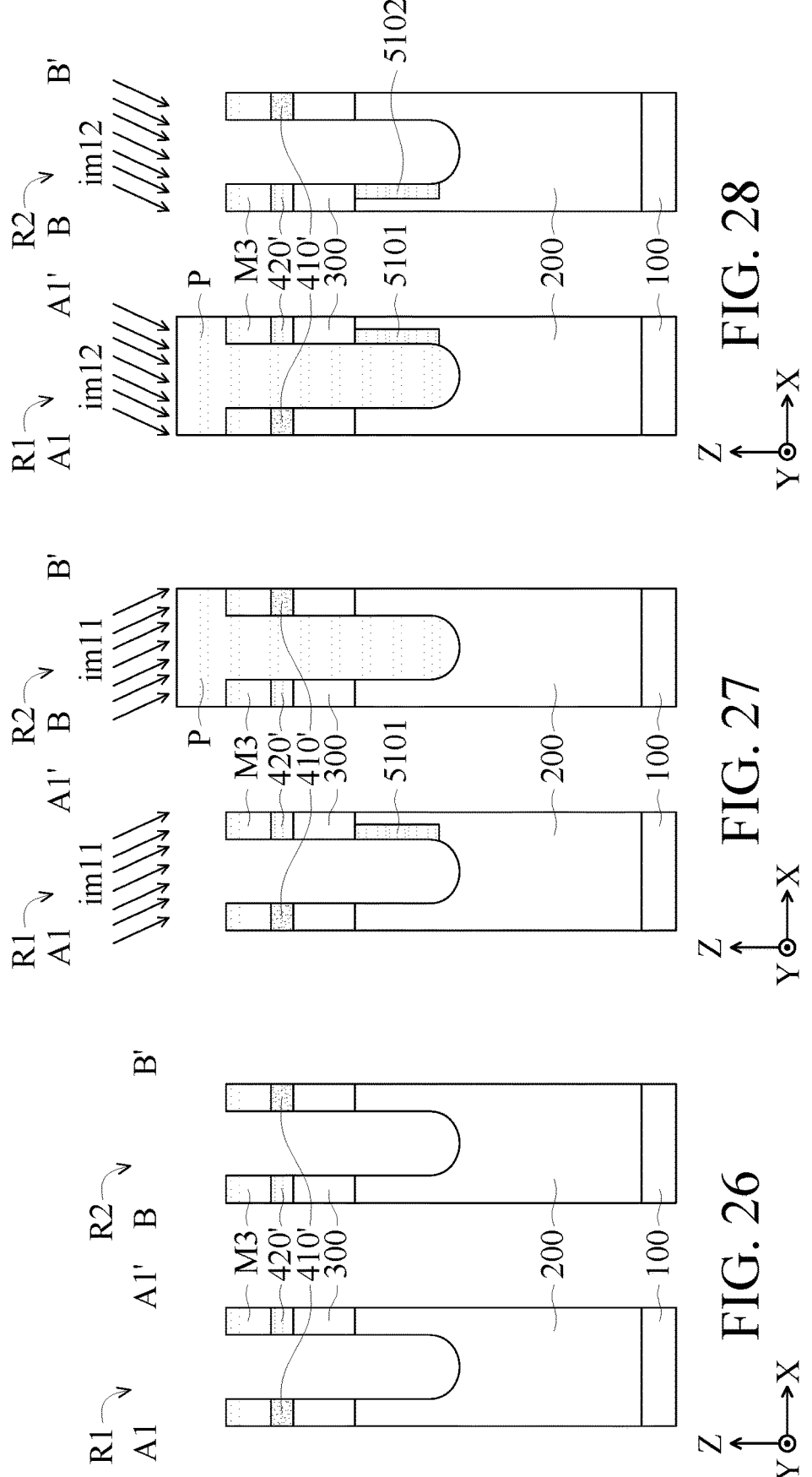

Referring to FIG. 26, FIG. 26 is similar to FIG. 5, and the difference is that: in the first region R1 and the second region R2, the trenches O are formed in the epitaxy layer 200. It should be noted that although the cross-sectional view is divided into two cross-sectional views by the A1-A1' section line and the B-B' section line, the trench O in the first region R1 and in the second region R2 extending along the direction Y is the same trench.

Referring to FIGS. 27-31, a doping region 500 is formed. As shown in FIG. 27, the photoresist P is overfilled in the trench O in the second region R2, and the first ion implantation process im11 is performed on one sidewall of the trench O in the first region R1, so that the sidewall doping region 5101 is formed in the first region R1. Then, the photoresist P in the second region R2 is removed. In some embodiments, the photoresist P may protect the underlying layer from further doping during the ion implantation, and may be removed after the ion implantation is completed. In the embodiment of FIG. 27, the first ion implantation process im11 includes dopant with the first conductivity type, such as n-type (for example, nitrogen), so the sidewall doping region 5101 has the first conductivity type.

As shown in FIG. 28, overfilling the photoresist P in the trench O in the first region R1, and performing another first ion implantation process im12 on one sidewall of the trench O in the second region R2 to form the sidewall doping region 5102 in the second region R2. Then, removing the photoresist P in the first region R1. In the embodiment of FIG. 28, another first ion implantation process im12 includes dopant with the first conductivity type, such as n-type (for example, nitrogen), so the sidewall doping region 5102 has the first conductivity type.

Figures 29, 30, 31:
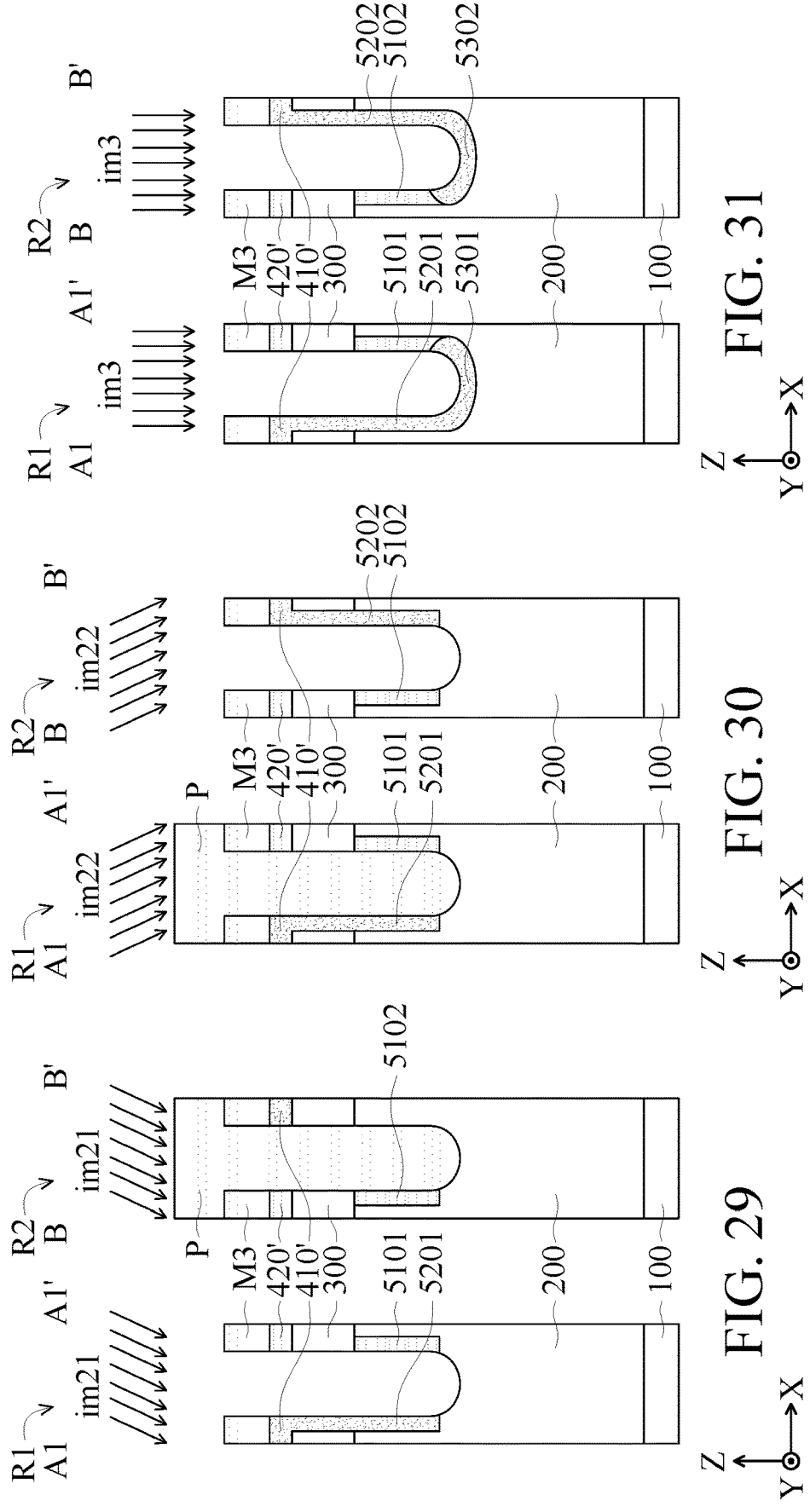

As shown in FIG. 29, overfilling the photoresist P in the trench O in the second region R2, and performing the second ion implantation process im21 on the other sidewall of the trench O in the first region R1 to form the sidewall doping region 5201 in the first region R1. Then the photoresist P in the second region R2 is removed. In the embodiment of FIG. 29, the second ion implantation im21 includes dopant with the second conductivity type, such as p-type (for example, aluminum), so the sidewall doping region 5201 has the second conductivity type.

As shown in FIG. 30, overfilling the photoresist P in the trench O in the first region R1, and performing another second ion implantation process im22 on the other sidewall of the trench O in the second region R2 to form a sidewall doping region 5202 in the second region R2. Then, removing the photoresist P in the first region R1. In the embodiment of the present invention, another second ion implantation process im22 includes dopant with the second conductivity type, such as p-type (for example, aluminum), so the sidewall doping region 5202 has the second conductivity type.

As shown in FIG. 31, FIG. 31 is similar to FIG. 8. The third ion implantation process im3 is performed on the bottom of the trench O in the first region R1 and in the second region R2 at the same time to form bottom doping regions 5301 and 5302 (or collectively referred to as 530 in FIG. 8) in the first region R1 and in the second region R2. In the embodiment of FIG. 31, the third ion implantation process im3 includes dopant with the second conductivity type, such as p-type (for example, aluminum), so that the bottom doping regions 5301 and 5302 have the second conductivity type. In some embodiments, the sidewall doping region 5102 is connected to the sidewall doping region 5202 through the bottom doping region 5302.

It should be noted that although the embodiment of the present invention describes the formation of the doping region 500 in the order as shown in FIGS. 27-31, the skilled person in the art may adjust the order of the steps appropriately according to actual needs. For example, the third ion implantation process may be performed first to form the bottom doping region, and the sidewall doping region in the first region R1 is then formed, and finally the sidewall doping region in the second region R2 is formed.

As above, by forming sidewall doping regions with different conductivity types on one side of the trench (that is, the conductivity type of the sidewall doping region in the second region is opposite to the conductivity type of the sidewall doping region in the first region), the current concentration on the same side may be avoided, thereby preventing the temperature rise on one side, and effectively avoiding the overheating (thermal runaway) of the parasitic bipolar junction transistor (BJT).

Figure 32:
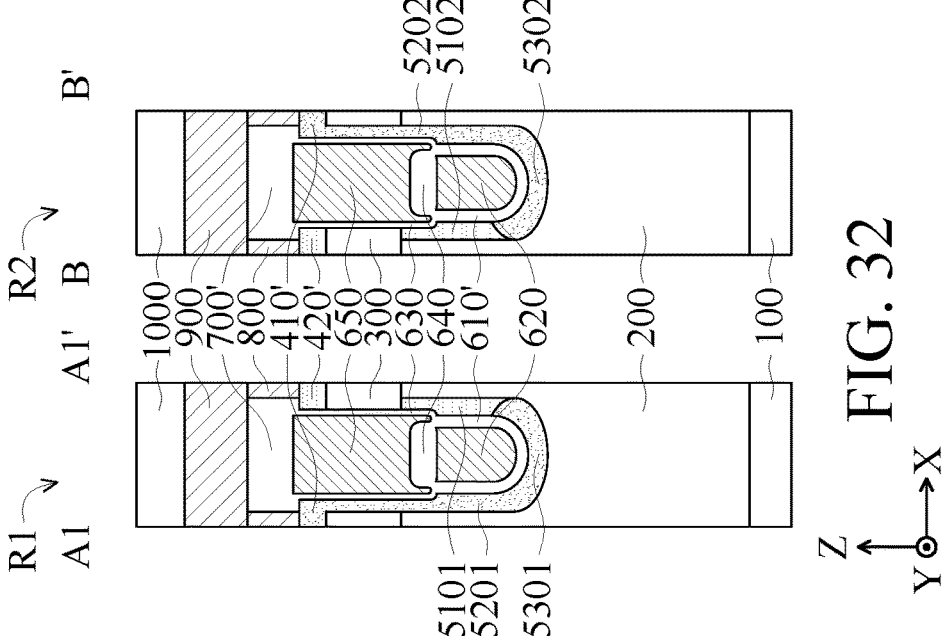

Next, referring to FIG. 32, an electrode structure 600, an interlayer dielectric layer 700, a contact 800, a source electrode 900, and a passivation layer 1000 are formed, which are similar to those described above, and thus will not be repeated here. In some embodiments, sidewall doping regions 5101 and 5201 are respectively disposed on both sides of the electrode structure 600 in the first region R1 (section line A1-A1'), and sidewall doping regions 5102 and 5202 are respectively disposed on both sides of the electrode structure 600 in the second region R2 (section line B-B'). That is, the doping region 500 in the first region R1 surrounds the electrode structure 600 in the first region R1, and the doping region 500 in the second region R2 surrounds the electrode structure 600 in the second region R2.

FIGS. 33-43 are schematic diagrams according to further some another embodiments of the present invention.

Figure 34:
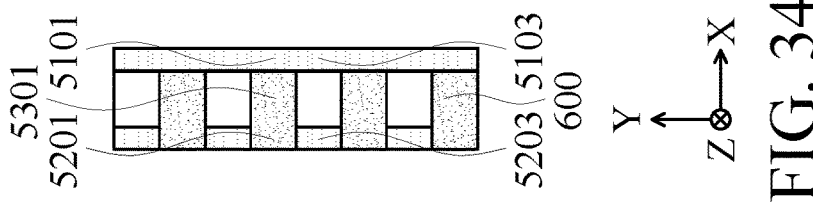
FIG. 34 is a top view viewed from bottom to top illustrating some elements of a semiconductor device according to further some another embodiments of the present disclosure.
Figure 33:
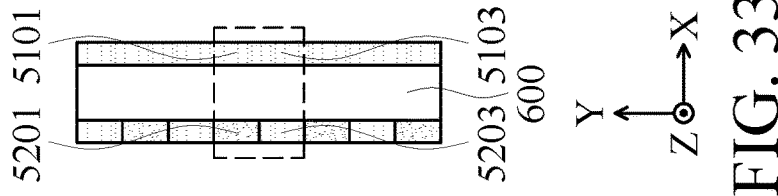
FIG. 33 is a top view viewed from top to bottom illustrating some elements of a semiconductor device according to further some another embodiments of the present disclosure.

FIG. 33 and FIG. 34 respectively illustrate top views viewed from top to bottom and from bottom to top according to still other embodiments. FIG. 33 is similar to FIG. 19, and the difference is that along one side of the electrode structure 600, there are sidewall doping regions with different conductivity types alternately arranged, and on the other side of the electrode structure 600, there are sidewall doping regions with the same conductivity type extending continuously. In FIG. 34, it may be seen that the bottom doping region 5301 with the second conductivity type extends discontinuously along the direction Y and does not completely cover the electrode structure. That is, bottom doping regions 5301 are spaced apart from each other.

Figure 35:
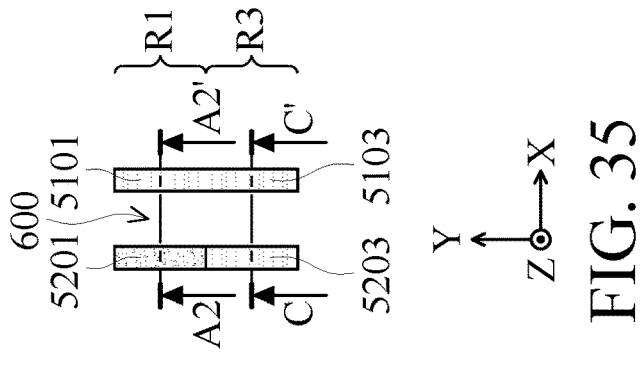
FIG. 35 is an enlarged view of the frame in FIG. 33.

In order to facilitate the description of the subsequent forming process, the enlarged schematic diagram of the frame in FIG. 33 is shown as FIG. 35. In FIG. 35, the doping region is divided into a first region R1 and a third region R3 along the extension direction (or direction Y) of the electrode structure 600. That is, the first region R1 has sidewall doping regions 5101 and 5201 with the first conductivity type and the second conductivity type respectively; the third region R3 has sidewall doped regions 5103 and 5203 with the second conductivity type. In other words, in FIG. 35, sidewall doping regions with different conductivity types extend along one side of the same electrode structure 600, and sidewall doping regions with the same conductivity type extend along the other side of the same electrode structure 600. In FIG. 35, the sidewall doping region 5101 is connected to the sidewall doping region 5103. It should be noted that the boundary between the sidewall doping regions 5201 and 5203 with different conductivity types is divided into the first region R1 and the third region R3.

Referring to FIGS. 36-43, they are cross-section views at different stages for the section line A2-A2' (first region R1) and section line C-C' (second region R2) corresponding to FIG. 35. Additional operations may be provided before, during, and/or after the stages described in FIGS. 36-43. In various embodiments, some of the aforementioned operations may be moved, deleted or replaced. Additional components may be added to the semiconductor device. In various embodiments, some of the components described below may be removed, deleted or substituted.

It should be noted that in this embodiment, in order to simplify the drawing, the structure of a single transistor (including a single electrode structure) will be shown later for description. Moreover, the structure in the first region R1 is similar to the embodiment in FIGS. 1-17 (or the structure in the first region R1 as shown in FIGS. 24-32), so the description will focus on the structure in the third region R3 later.

Figures 36, 37, 38:
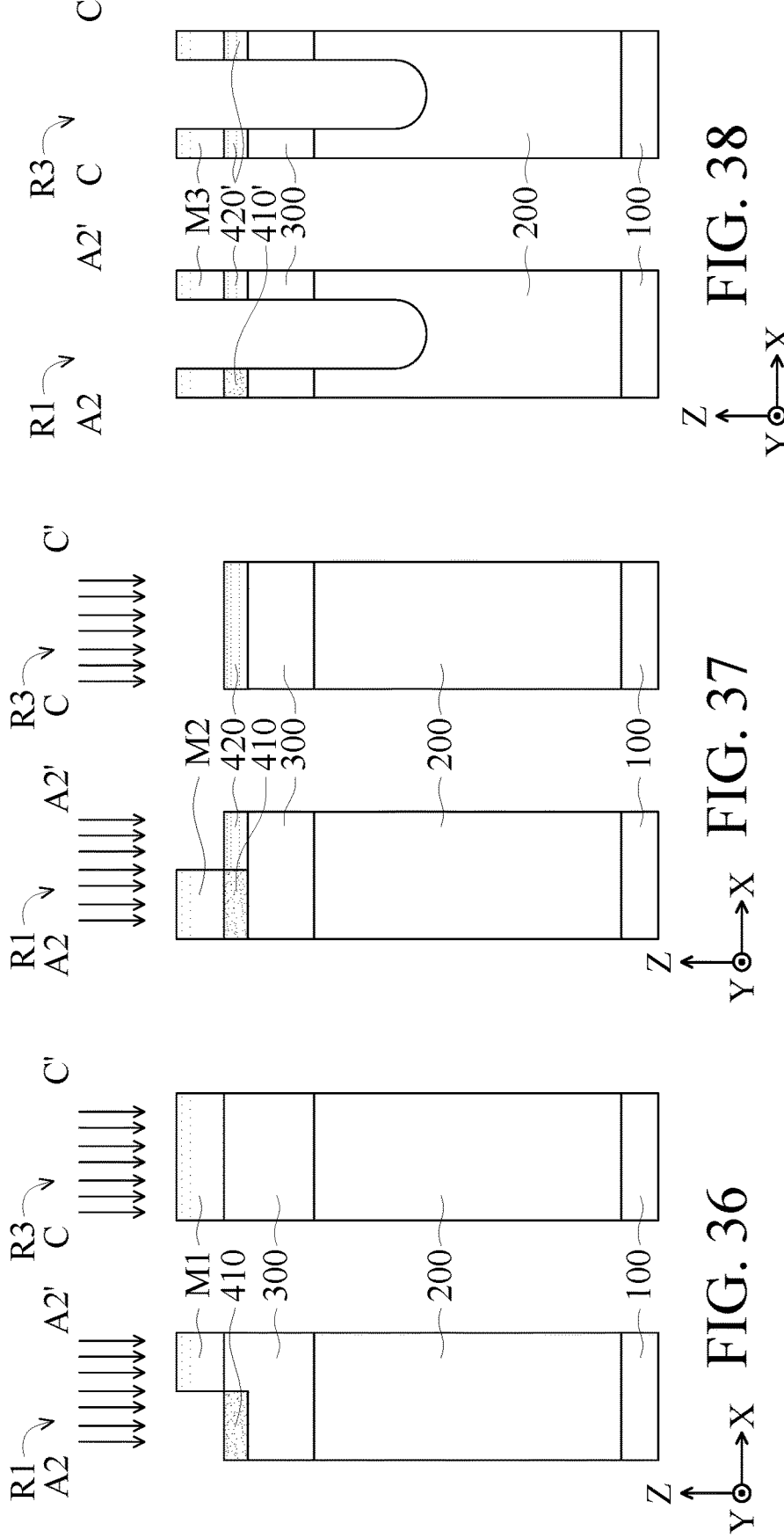
FIGS. 36-43 are cross-sectional views illustrating the formation of a semiconductor device at different stages according to further some another embodiments of the present disclosure.

Referring to FIG. 36, FIG. 36 is similar to FIG. 3, and the difference is that in the third region R3, a mask M1 is disposed at non-predetermined doping positions (for example, the entire area of the third region R3) to avoid the ion implantation process from affecting the well region 300 in the third region R3. Then, the mask M1 is removed.

Referring to FIG. 37, FIG. 37 is similar to FIG. 4. The difference is that no mask M2 is disposed in the third region R3, and a blanket ion implantation is performed on the well region 300 through an ion implantation to form a second contact doping region 420 in the well region 300 in the third region R3. In the embodiment of FIG. 37, the ion implantation includes dopant with the first conductivity type, such as n-type dopants (for example, nitrogen), so the second contact doping region 420 has the first conductivity type. It should be noted that in the third region R3, the contact doping region 400 only includes the second contact doping region 420 with the first conductivity type.

Referring to FIG. 38, FIG. 38 is similar to FIG. 5. The difference is that: in the first region R1 and the third region R3, the trench O are formed in the epitaxy layer 200. It should be noted that although the cross-sectional view is divided into two cross-sectional views by the section line A2-A2' and the section line C-C', the trench O in the first region R1 and in the third region R3 extending along the direction Y is the same trench.

Figures 39, 40, 41:
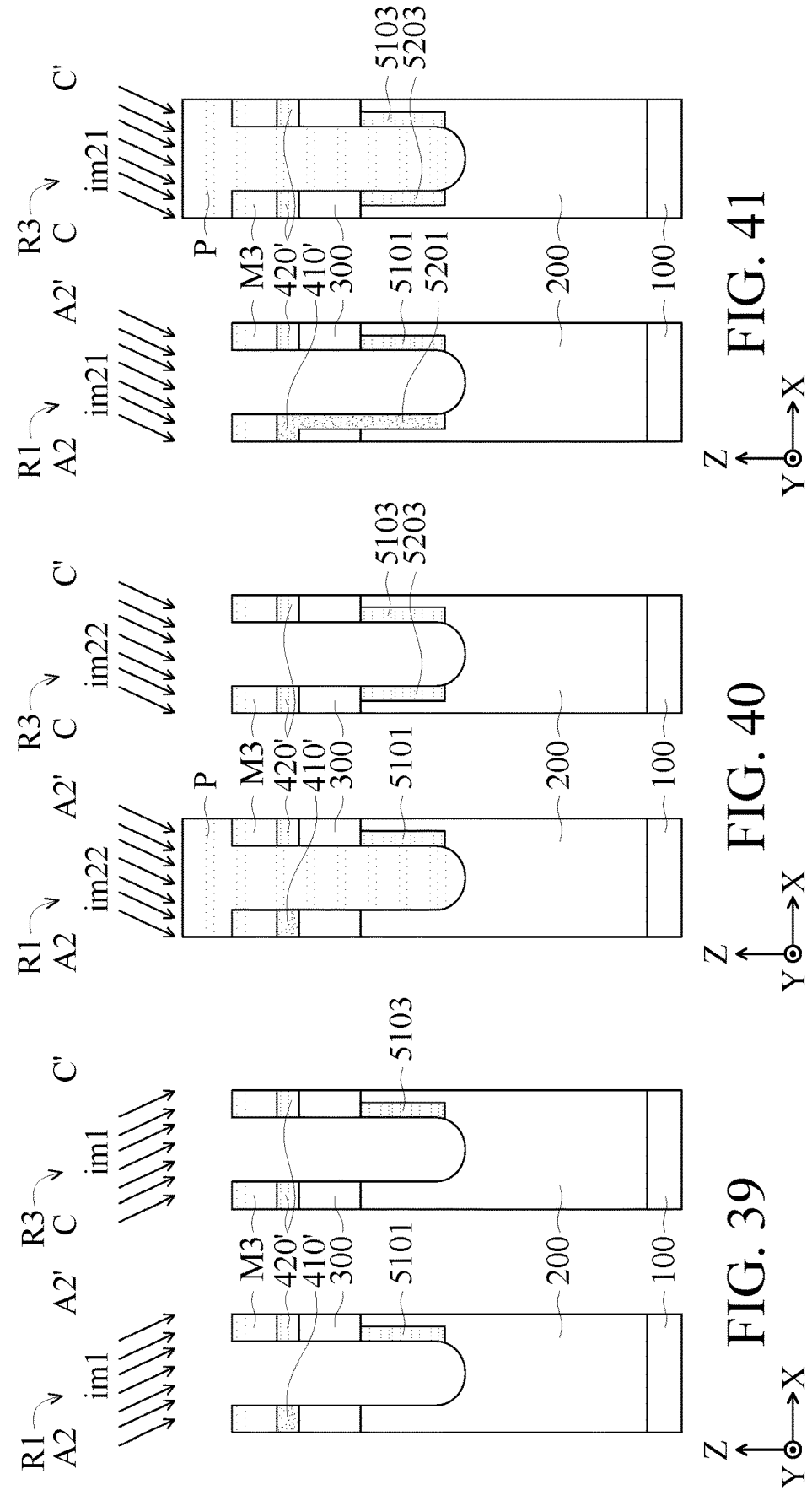

Referring to FIGS. 39-42, a doping region 500 is formed. As shown in FIG. 39, the first ion implantation process im1 is performed on one sidewall of the trench O in the first region R1 and the third region R3 at the same time to form sidewall doping regions 5101 and 5103 in the first region R1 and the third region R3 respectively. In the embodiment of FIG. 39, the ion implantation process im1 includes dopant with first conductivity type, such as n-type (for example, nitrogen), so the sidewall doping regions 5101 and 5103 both have the first conductivity type.

As shown in FIG. 40, overfilling the photoresist P in the trench O in the first region R1, and performing the second ion implantation process im22 on the other sidewall of the trench O in the third region R3 to form a sidewall doping region 5203 in the third region R3. Then, removing the photoresist P in the first region R1. In the embodiment shown in FIG. 40, the second ion implantation process im22 includes dopant with the first conductivity type, such as n-type (for example, nitrogen), so the sidewall doping region 5203 has the first conductivity type.

As shown in FIG. 41, overfilling the photoresist P in the trench O in the third region R3, and performing another second ion implantation im21 on the other sidewall of the trench O in the first region R1 to form a sidewall doping region 5201 in the first region R1. In the embodiment of FIG. 41, another second ion implantation im21 includes dopant with the second conductivity type, such as p-type (for example, aluminum), so the sidewall doping region 5201 has the second conductivity type.

Figures 42, 43:
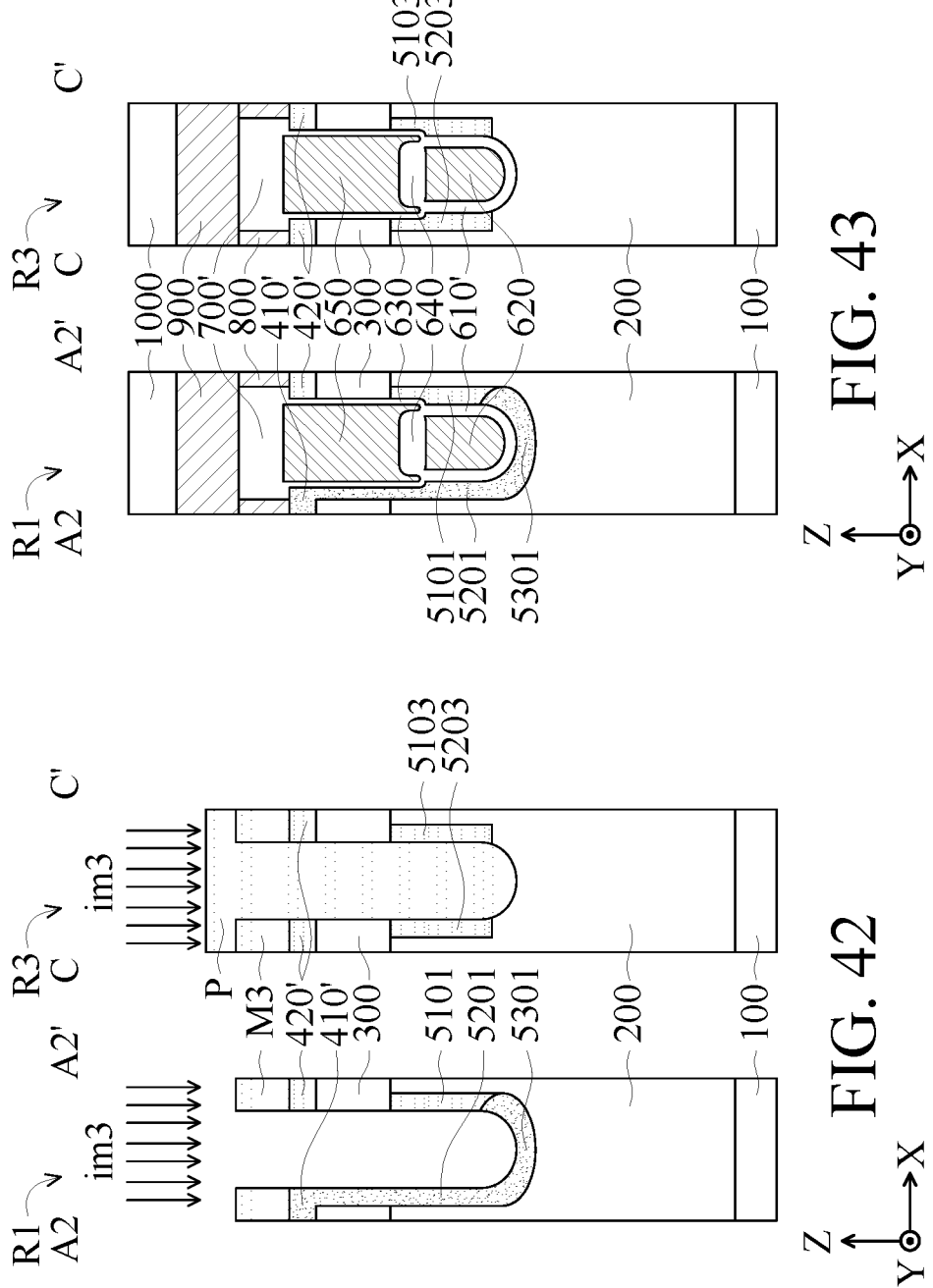

As shown in FIG. 42, keeping the photoresist P in the trench O in the third region R3, and performing the third ion implantation process im3 on the bottom of the trench O in the first region R1 to form a bottom doping region 5301 in the first region R1. Then, removing the photoresist P in the third region R3. In the embodiment of FIG. 42, the third ion implantation process im3 includes dopant with the second conductivity type, such as p-type (for example, aluminum), so the bottom doping region 5301 has the second conductivity type.

It should be noted that although the embodiment of the present invention describes the formation of the doping region 500 in the order as shown in FIGS. 39-42, the skilled person in the art may adjust the order of the steps appropriately according to actual needs. For example, the third ion implantation process may be performed first to form the bottom doping region, and then the sidewall doping region in the first region R1 is formed, and finally the sidewall doping region in the third region R3 is formed.

As above, by forming continuously extending sidewall doping regions with the first conductivity type on one side of the trench O and forming sidewall doping regions with the first conductivity type and the second conductivity type alternately arranged on the other side, the channel area may be increased, thereby reducing the channel resistance and reducing the switch resistance. Moreover, the surface electric field at the corner of the bottom may be effectively reduced by the discontinuously extending bottom doped region.

Next, referring to FIG. 43, an electrode structure 600, an interlayer dielectric layer 700, a contact 800, a source electrode 900, and a passivation layer 1000 are formed, which are similar to those described above, and thus will not be repeated here. In the embodiment of FIG. 43, in the third region R3, the bottom of the electrode structure 600 is in direct contact with the epitaxy layer 200. In some embodiments, sidewall doping regions 5101 and 5201 are respectively disposed on both sidewalls of the electrode structure 600 in the first region R1 (section line A2-A2'), and sidewall doping regions 5103 and 5203 are respectively disposed on both sidewalls of the electrode structure 600 in the third region R3 (section line C-C'). That is, the doping region 500 in the first region R1 surrounds the electrode structure 600 in the first region R1, and the doping region 500 in the third region R3 surrounds the electrode structure 600 in the third region R3.

To sum up, the embodiment of the present invention may reduce the surface electric field and reduce the on-resistance (Rdson) by the doping regions with different conductivity types on both sidewalls of the electrode structure. In the embodiment of the present invention, the electric field may be reduced and the breakdown voltage may be increased by the bottom doping region covering the bottom of the electrode structure. In the embodiment of the present invention, by the split-gate trench electrode structure, the contact area between the gate electrode and the drift region may be further reduced, and the gate-to-drain capacitance (Cgd) may be reduced more effectively.

In addition, in the embodiment of the present invention, the sidewall doping regions with the first conductivity type (or the second conductivity type) are evenly distributed on both sides of the electrode structure, which may avoid current concentration on the same side and prevent overheating. In addition, in the embodiment of the present invention, the sidewall doping regions with the first conductivity type are continuously disposed on one side of the electrode structure, and the sidewall doping regions with the second conductivity type and the first conductivity type alternately arranged on the other side of the electrode structure to lower the channel resistance. Moreover, the surface electric field is more effectively reduced by the discontinuous bottom doping regions.

The protection scope of the present disclosure is not limited to the process, machine, manufacture, material composition, device, method and step in the specific embodiments described in the specification. In the disclosure of the embodiments, it is understood that current or future processes, machines, manufactures, compositions of matter, devices, methods and steps can be implemented as long as substantially the same functions or substantially the same results can be achieved in the embodiments described herein. Use according to some embodiments of the present disclosure. Therefore, the protection scope of the present disclosure includes the aforementioned process, machine, manufacture, composition of matter, apparatus, method and steps. In addition, each claimed scope constitutes a separate embodiment, and the protection scope of the present disclosure also includes the combination of each claimed scope and the embodiments.

While the embodiments and the advantages of the present disclosure have been described above, it should be understood that those skilled in the art may make various changes, substitutions, and alterations to the present disclosure without departing from the spirit and scope of the present disclosure. It should be noted that different embodiments may be arbitrarily combined as other embodiments as long as the combination conforms to the spirit of the present disclosure. In addition, the scope of the present disclosure is not limited to the processes, machines, manufacture, composition, devices, methods and steps in the specific embodiments described in the specification. Those skilled in the art may understand existing or developing processes, machines, manufacture, compositions, devices, methods and steps from some embodiments of the present disclosure. Therefore, the scope of the present disclosure includes the aforementioned processes, machines, manufacture, composition, devices, methods, and steps. Furthermore, each of the appended claims constructs an individual embodiment, and the scope of the present disclosure also includes every combination of the appended claims and embodiments.

What is claimed is:
1. A semiconductor device, comprising:
   a substrate having a first conductivity type;
   an epitaxy layer disposed on the substrate and having the first conductivity type;
   an electrode structure disposed in the epitaxy layer, wherein the electrode structure extends in a first direction;

a well region disposed on a side of the electrode structure and having the second conductivity type;

a contact doping region disposed in the well region, a first sidewall doping region disposed on a side of the electrode structure and having the first conductivity type;

a second sidewall doping region disposed on another side of the electrode structure and having a second conductivity type different from the first conductivity type; and a bottom doping region disposed under the electrode structure and having the second conductivity type, wherein the second sidewall doping region is connected to the bottom doping region and the second sidewall doping region extends from the well region to the bottom doping region, wherein the first sidewall doping region is separated from the contact doping region by the well region, wherein the second sidewall doping region penetrates through the well region and contacts the contact doping region.

2. The semiconductor device as claimed in claim 1, wherein the electrode structure comprises an insulation portion, a top electrode and a bottom electrode, wherein the top electrode and the bottom electrode are separated by the insulation portion.

3. The semiconductor device as claimed in claim 2, wherein the second sidewall doping region covers an entire sidewall of the bottom electrode.

4. The semiconductor device as claimed in claim 1, further comprising:

another electrode structure disposed beside the electrode structure in a second direction, wherein the another electrode structure is separated from the electrode structure by the epitaxy layer;

another first sidewall doping region disposed on a side of the another electrode structure and having the first conductivity type;

another second sidewall doping region disposed on another side of the another electrode structure and having the second conductivity type; and another bottom doping region disposed under the another electrode structure and having the second conductivity type, wherein the another second sidewall doping region is connected to the another bottom doping region, wherein the first sidewall doping region of the electrode structure, the another second sidewall doping region of the another electrode structure, and the epitaxy layer disposed between the first sidewall doping region and the another second sidewall doping region are a super-junction.

5. The semiconductor device as claimed in claim 1, wherein the electrode structure is divided into a first region and a second region along the first direction in a top view, wherein the first sidewall doping region in the first region and the second sidewall doping region in the first region are defined as a sub first sidewall region and a sub second doping region respectively, wherein the semiconductor device further comprises:

a sub third sidewall doping region disposed on a side of the electrode structure in the second region; and a sub fourth sidewall doping region disposed on another side of the electrode structure in the second region.

6. The semiconductor device as claimed in claim 5, wherein the sub third sidewall doping region and the sub fourth sidewall doping region have the first conductivity type and the second conductivity type, respectively, wherein the semiconductor device further comprises:

another bottom doping region disposed under the electrode structure in the second region and having the second conductivity type, wherein the sub fourth sidewall doping region is connected to the another bottom doping region.

7. The semiconductor device as claimed in claim 6, wherein the bottom doping region is connected to the another bottom doping region.

8. The semiconductor device as claimed in claim 5, wherein the sub third sidewall doping region and the sub fourth sidewall doping region have the first conductivity type, wherein in the second region, a bottom of the electrode structure is in direct contact with the epitaxy layer.

9. The semiconductor device as claimed in claim 1, wherein the contact doping region comprises a first contact doping region and a second contact doping region adjacent to each other, wherein the first contact doping region and the second contact doping region have the first conductivity type and the second conductivity type, respectively, wherein the second sidewall doping region contacts the second contact doping region.

10. A method for forming the semiconductor device as set forth in claim 1, comprising:

providing the substrate having the first conductivity type;

forming the epitaxy layer on the substrate, wherein the epitaxy layer has the first conductivity type;

forming a trench in the epitaxy layer along the first direction;

forming a doping region surrounding the trench, wherein forming the doping region comprises:

performing a first ion implantation and a second ion implantation on both sides of the trench in a way that is not perpendicular to the substrate to form the first sidewall doping region and the second sidewall doping region, wherein the first sidewall doping region and the second sidewall doping region respectively have the first conductivity type and the second conductivity type; and forming the electrode structure in the trench.

11. The method as claimed in claim 10, wherein performing the first ion implantation comprises not performing an ion implantation on a bottom of the trench.

12. The method as claimed in claim 10, further comprising:

performing a third ion implantation on a bottom of the trench to form a bottom doping region, wherein the bottom doping region has the second conductivity type.

13. The method as claimed in claim 12, further comprising:

while forming the trench, forming another trench on a second direction of the trench in the epitaxy layer, wherein the second direction is perpendicular to the first direction;

while forming the doping region, forming another doping region surrounding the another trench, wherein the another doping region is separated from the doping region by the epitaxy layer; and while forming the electrode structure, forming another electrode structure on the second direction of the electrode structure in the another trench.

14. The method as claimed in claim 10, wherein the trench is divided into a first region and a second region along the first direction, wherein the doping region is formed in the first region, wherein the method further comprises:

forming another doping region surrounding the trench in the second region.

15. The method as claimed in claim 14, wherein forming the another doping region in the second region comprises:

overfilling a photoresist in the trench in the first region;

performing a third ion implantation and a fourth ion implantation on both sides of the trench in the second region, respectively, to form a third sidewall doping region and a fourth sidewall doping region with different conductivity types;

removing the photoresist.

16. The method as claimed in claim 15, wherein forming the doping region further comprises:

before performing the first ion implantation and the second ion implantation, overfilling another photoresist in the trench in the second region; and after performing the first ion implantation and the second ion implantation, removing the another photoresist.

17. The method as claimed in claim 14, wherein forming the doping region in the first region and forming the another doping region in the second region further comprises:

performing a third ion implantation on a bottom of the trench in the first region and the second region to form a bottom doping region, wherein the bottom doping region has the second conductivity type.

18. The method as claimed in claim 14, wherein forming the doping region in the first region and forming the another doping region in the second region comprises:

performing the first ion implantation on a sidewall of the trench in the first region and the second region to form the first sidewall doping region and a third sidewall doping region respectively in the first region and the second region;

overfilling a photoresist in the trench in the first region;

performing a third ion implantation on the other sidewall of the trench in the second region to form a fourth sidewall doping region in the second region;

removing the photoresist;

overfilling another photoresist in the trench in the second region;

performing the second ion implantation on the other sidewall of the trench in the first region to form the second sidewall doping region in the first region; and removing the another photoresist.

19. The method as claimed in claim 18, wherein forming the doping region in the first region and forming the another doping region in the second region further comprises:

while the trench is overfilled with the photoresist in the second region, performing a fourth ion implantation on a bottom of the trench in the first region to form a bottom doping region, wherein the bottom doping region has the second conductivity type.

* * * * *